(12) United States Patent
Mills

(10) Patent No.: US 9,825,347 B2
(45) Date of Patent: Nov. 21, 2017

(54) PRECISION BATCH PRODUCTION METHOD FOR MANUFACTURING FERRITE RODS

(71) Applicant: KONINKLIJKE PHILIPS N.V., Eindhoven (NL)

(72) Inventor: John Brean Mills, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/027,286

(22) PCT Filed: Oct. 1, 2014

(86) PCT No.: PCT/EP2014/071079
§ 371 (c)(1),
(2) Date: Apr. 5, 2016

(87) PCT Pub. No.: WO2015/052059
PCT Pub. Date: Apr. 16, 2015

(65) Prior Publication Data
US 2016/0254579 A1 Sep. 1, 2016

(30) Foreign Application Priority Data

Oct. 7, 2013 (EP) ..................................... 13187538

(51) Int. Cl.
| | |
|---|---|
| *H01P 1/19* | (2006.01) |
| *H01F 41/32* | (2006.01) |
| *H01F 41/14* | (2006.01) |
| *H01P 3/12* | (2006.01) |
| *H01L 43/12* | (2006.01) |

(Continued)

(52) U.S. Cl.
CPC ............... *H01P 1/19* (2013.01); *H01F 41/14* (2013.01); *H01F 41/32* (2013.01); *H01P 3/12* (2013.01); *H01F 41/046* (2013.01); *H01L 21/02197* (2013.01); *H01L 43/12* (2013.01)

(58) Field of Classification Search
None
See application file for complete search history.

(56) References Cited

U.S. PATENT DOCUMENTS

| | | |
|---|---|---|
| 5,459,439 A | 10/1995 | Marusawa et al. |
| 5,772,820 A | 6/1998 | Schoch et al. |
| 5,828,271 A | 10/1998 | Stitzer |

(Continued)

OTHER PUBLICATIONS

Babbitt, R.W. et al., "Fabrication and Performance of Ferrite Phase Shifters for Millimeter Frequencies", IEEE Transactions on Magnetics, vol. Mag-15, No. 6, Nov. 1979.

(Continued)

*Primary Examiner* — Andres Munoz

(57) ABSTRACT

The present invention relates to a method of manufacturing a ferrite rod. The method comprises etching cavities into two semiconductor substrates and depositing ferrite layers into the cavities. The semiconductor substrates are attached to each other such that the ferriote layers form a ferrite rod. The present invention employs conventional photolithography and bulk isotropic micromachining of semiconductor wafers to precisely and repeatably form a template or mold, into which magnetic material can be deposited to form a Faraday rotation or phase-shifting element.

16 Claims, 26 Drawing Sheets

(51) Int. Cl.
*H01L 21/02* (2006.01)
*H01F 41/04* (2006.01)

(56) References Cited

U.S. PATENT DOCUMENTS

| | | | |
|---|---|---|---|
| 5,876,539 | A | 3/1999 | Bailey et al. |
| 6,060,433 | A | 5/2000 | Li et al. |
| 6,171,886 | B1* | 1/2001 | Ghosh ................... B81B 3/0035 438/3 |
| 6,498,549 | B1 | 12/2002 | Jiang et al. |
| 6,600,601 | B1 | 7/2003 | Ikari et al. |
| 6,673,181 | B1* | 1/2004 | Berry ....................... H01P 1/195 156/182 |
| 2003/0169133 | A1 | 9/2003 | Torigoe et al. |
| 2005/0275586 | A1 | 12/2005 | Macdonald |
| 2007/0154155 | A1 | 7/2007 | Brist et al. |
| 2007/0243654 | A1 | 10/2007 | Stratton et al. |
| 2008/0131821 | A1 | 6/2008 | Sandstrom |
| 2009/0029185 | A1* | 1/2009 | Lee ......................... H01F 41/046 428/573 |
| 2009/0230955 | A1* | 9/2009 | Kejik ....................... G01R 33/04 324/253 |
| 2011/0123783 | A1 | 5/2011 | Sherrer |
| 2015/0035638 | A1* | 2/2015 | Stephanou ............... H01F 27/24 336/200 |

OTHER PUBLICATIONS

Kovacs, G.T.A. et al., "Bulk Micromachining of Silicon", Proceedings of the IEEE, vol. 86, No. 8, Aug. 1998, pp. 1536-1551.
Shetye, S.B. et al., "Magnetic Self-Assembly of Millimeter-Scale Components with Angular Orientation", Journal of Microelectromechanical Systems, vol. 19, No. 3, Jun. 2010, pp. 599-609.
Reuss, M.L., "A study of a ferrite phase shifter", NRL Report 6112, Jun. 8, 1964, U.S. Naval Research Labor, Washington, D.C.
Pechurkin, N.S. et al., "The design of reciprocal ferrite phase shifters", Soviet Physics Journal, p. 39-42.
Reggia, F., "K-band reciprocal ferrite phase modulator", Diamond Ordinance Fuze Labs, (1961), Washington, D.C., p. 269-270.
Reggia, F. "A new broad-band absorption modulator for rapid switching of microwave power", IRE Transactions on Microwave Theory and Techniques, p. 343-349, (1961).
Geiszler, T.D. et al., "Broadband reciprocal ferrite phase shifters", Journal of Applied Physics, Supplement to vol. 11, No. 5, May 1968.
Reuss, M.L., "Phase-shift enhancement by mode-suppression techniques", Apr. 30, 1968, NRL Report 6677, Naval Research Laboratory, Washington, D.C.
McCarter, R.S et al., "K-band ferrite phase shifter", Bell Telephone Labs., Inc., NJ, 1961, p. 271.
Reggia, F. et al., "A new technique in ferrite phase shifting for beam scanning of microwave antennas", Proceedings of the IRE, 1957, p. 1510-1517.
Mills, J.B. et al., "Waveguide tuner stabilized ultra low phase noise 60 GHz SiGe:C Oscillator MMIC", Philips Research, Conference Jan. 17-19, 2011, p. 1-4.
Button, K.J. et al., "Perturbation theory of the reciprocal ferrite phase-shifter", The Institute of Electrical Engineers, Paper No. 3600, Jun. 1961.
Cacheris, C., et al., "Microwave Apparatus—I", Discussion at the Convention on Ferrites, Nov. 2, 1956, p. 366-369.
Clavin, A., "Reciprocal Ferrite Phase Shifters in Rectangular Waveguide", Rantee Corp., p. 334 (1958).
Clavin, A., "Reciprocal Ferrite Phase Shifters". Rantee Corp., p. 254 (1958).

* cited by examiner

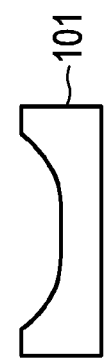
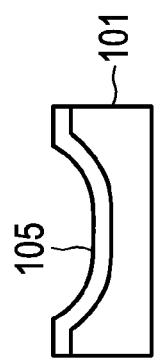
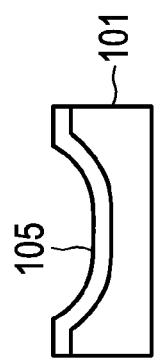
FIG. 1H
FIG. 1I
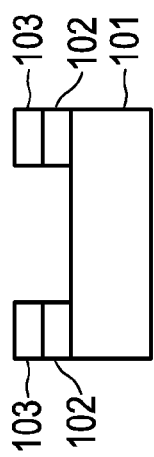
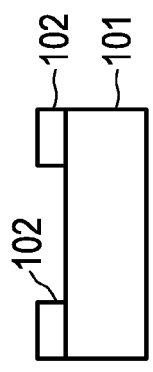
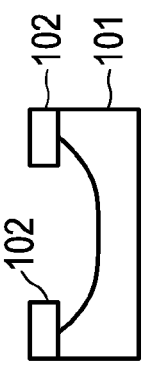
FIG. 1E
FIG. 1F
FIG. 1G
FIG. 1A
FIG. 1B
FIG. 1C
FIG. 1D

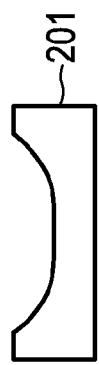
FIG. 2H
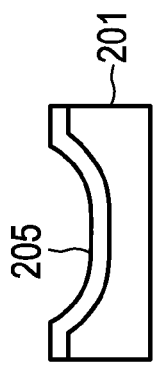
FIG. 2I
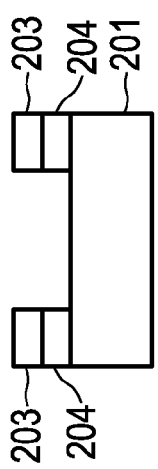
FIG. 2E
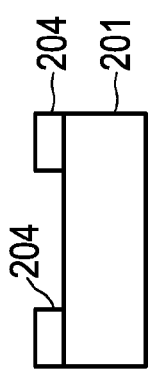
FIG. 2F
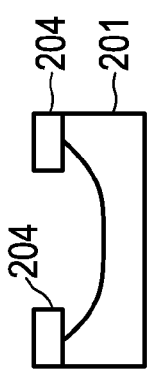
FIG. 2G
FIG. 2A
FIG. 2B
FIG. 2C
FIG. 2D

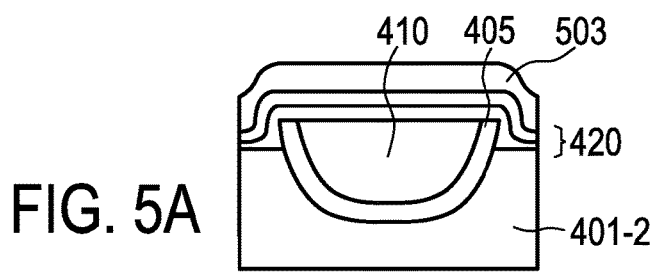
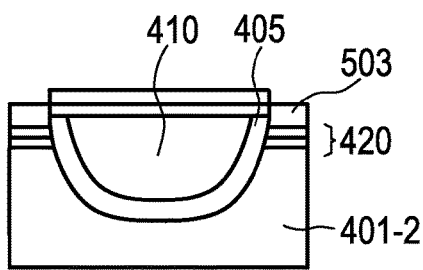
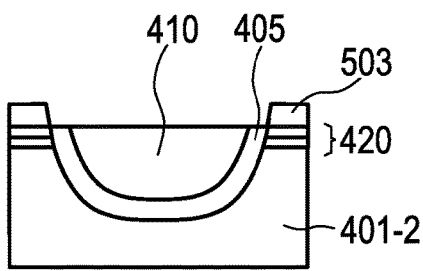
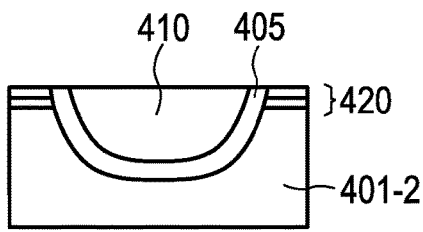
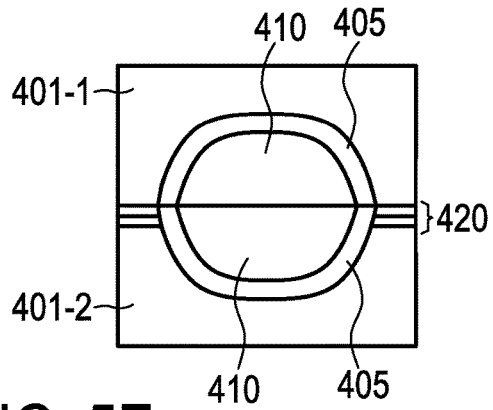
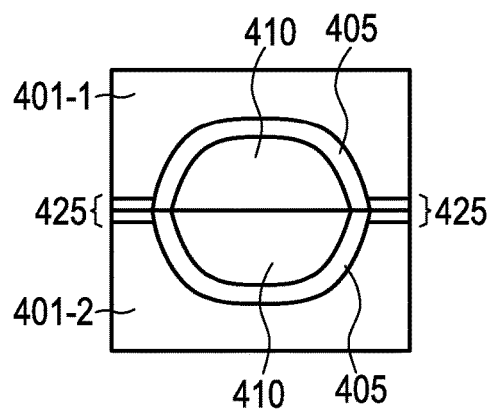

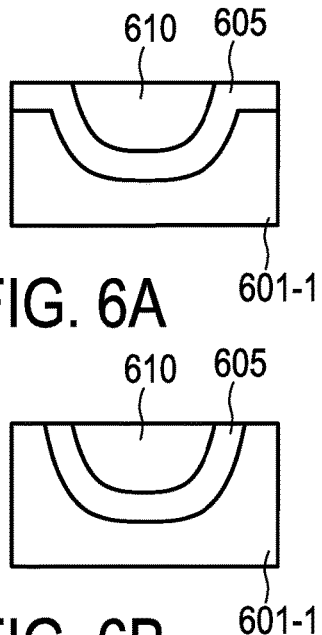
FIG. 6A
FIG. 6B
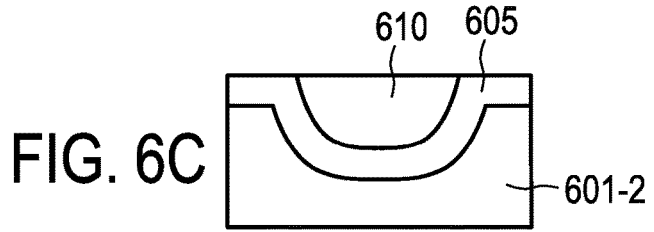
FIG. 6C
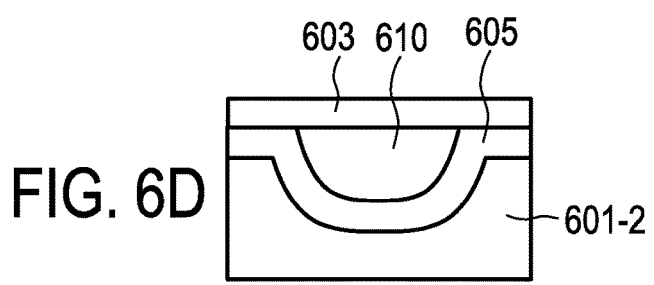
FIG. 6D
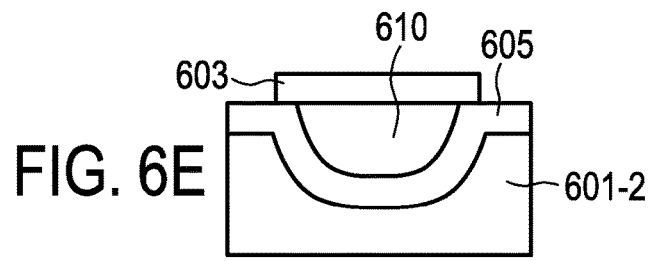
FIG. 6E
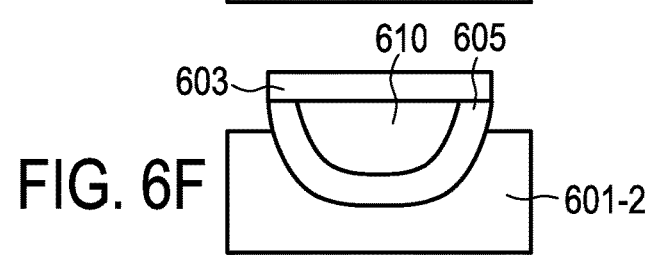
FIG. 6F
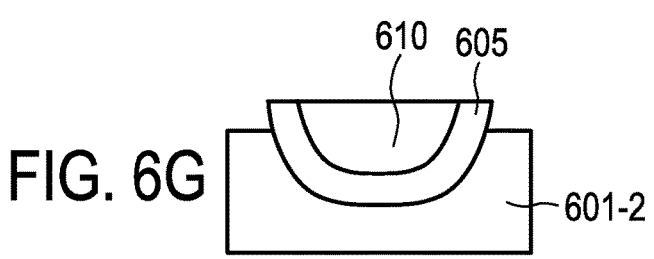
FIG. 6G
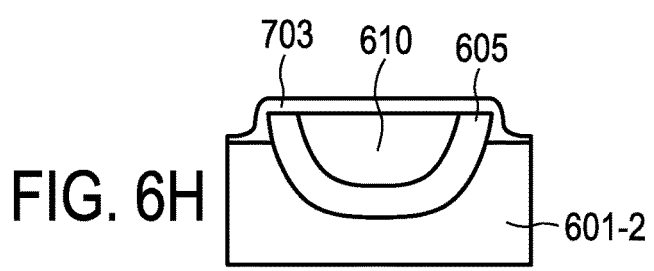
FIG. 6H

PRECISION BATCH PRODUCTION METHOD FOR MANUFACTURING FERRITE RODS

CROSS-REFERENCE TO PRIOR APPLICATIONS

This application is the U.S. National Phase application under 35 U.S.C. §371 of International Application Serial No. PCT/EP2014/071079, filed on Oct. 1, 2014, which claims the benefit of European Patent Application Serial No. 13187538.7, filed on Oct. 7, 2013. These applications are hereby incorporated by reference herein.

FIELD OF THE INVENTION

The invention relates to a method of manufacturing a ferrite rod, to a ferrite rod, and to a phase shifting device for manipulating radiation.

BACKGROUND OF THE INVENTION

Production of cylindrical ferrite rods by conventional manufacturing methods requires expensive and laborious centre-less diamond grinding to give a smooth walled cylinder that requires further diamond shaping still to taper the end sections of the rod. Each ferrite part must be individually ground and the dimensions and surface finish inspected prior to usage prior to inclusion into a device.

U.S. Pat. No. 6,673,181B1 discloses a fabrication process for ferrite toroids which utilizes ferrite ceramic tape having an improved elongation characteristic. The process utilizes a set of rigid mandrels which are employed in the final lamination to support the rectangular cross section of the internal cavity of a respective ferrite tube, thereby reducing stress concentration and permitting the highest lamination pressure to be used in the final step. The mandrels are removed prior to panel densification. The tape and mandrels operate together to minimize cracks and pores in the toroids and provide an added advantage of maintaining high tolerances in the internal cavity dimensions as well as the cavity-to-cavity alignment.

US 2003/169133 A1 discloses a transmission line comprising a first base having a substrate on which a groove is formed, a conductive film that is served as the ground electrode formed on the surface including said groove of said substrate, and dielectric material disposed on said conductive film of said groove portion. The transmission line comprises a second base having another conductive film that served as the ground electrode formed on the surface including said another substrate, and another dielectric material disposed on said another conductive film of said another groove portion, and a signal conductor, wherein said signal conductor is surrounded by dielectric material of said first base and dielectric material of said second base.

SUMMARY OF THE INVENTION

It is an object of the present invention to provide an improved device layout, an improved ferrite rod, and a production method that alleviate the above problems.

The present invention is defined by the independent claims. Dependent claims provide advantageous embodiments.

In a first aspect of the invention, a method of manufacturing a ferrite rod is provided.

The method of the present invention aims to overcome the fabrication problems described above by employing conventional photolithography and bulk isotropic micromachining of Silicon, or other semiconductor, wafers to precisely and repeatably form a template or mould, into which magnetic material (ferrite, garnet, antiferromagnet, hexaferrite etc) can be deposited to form the Faraday rotation or phase-shifting element. No more mechanical diamond grinding operations are required to shape the magnetic material into the desired form. In addition, the Silicon or other semiconductor substrate, is shaped in such a way as to form a low loss dielectric impedance transformation from the air-filled waveguide to the ferrite rod. This all occurs as a batch production manufacturing process using conventional semiconductor processing techniques and equipment. Batch processing produces many ferrite rod samples all at once from a single pair of semiconductor wafers. Easy modification of the magnetic device dimensions can be made by changes to the lithography mask-set. As shown by the data disclosed in Lamb J W (1996), *Miscellaneous Data on Materials for Millimeter and Submillimeter Optics*, International Journal of Infrared and Millimeter Waves, 17(12), 1997-2034, the choice of a high resistivity Silicon wafer as substrate provides both a low dielectric loss tangent and a real component of dielectric permittivity of around 11.7 making it a very close match to the magnetic materials likely to be used for Faraday rotation or phase-shifting and isolator applications. A highly suitable alternative substrate material which could be used, with appropriate modifications to the materials used for passivation and the chemicals and/or techniques used for micromachining, would be semi-insulating Gallium Arsenide. According to both Neidert R E (1980), *Dielectric constant of semi-insulating gallium arsenide*, Electronics Letters, 16(7), 244-245, and Moore W J, Holm R T (1996), *Infrared dielectric constant of gallium arsenide*, Journal of Applied Physics, 80(12), 6939-6942, this has a real component of dielectric permittivity of 12.9 providing an even closer match to the dielectric constant of ferrite materials. Alternative substrate materials could further include Magnesium Titanate ($Mg_2TiO_4$ and $MgTiO_3$) and Forsterite ($Mg_2SiO_4$).

According to a preferred aspect, said etching the first cavity into the first semiconductor substrate and said etching the second cavity into the second semiconductor substrate each comprise: performing isotropic semiconductor etching to selectively remove a layer of the semiconductor substrate; and growing a passivation layer on the semiconductor substrate. The cavities may be etched into the first and second semiconductor substrates by performing isotropic semiconductor etching. Isotropic semiconductor etching refers in particular to removing material from a substrate without a preferred direction. Isotropic etching may be performed, e.g., via a chemical process using an etchant substance, such as, e.g., a corrosive liquid or a chemically active ionized gas. The selective removal of semiconductor substrate layer(s) results in the forming of a cavity in an exposed surface of the semiconductor substrate. The exposed surface may be passivated, i.e., made to being less affected by environmental factors such as air or water. Passivation is preferably achieved by growing a passivation layer, i.e., a shielding outer layer of corrosion. The passivation layer may, e.g., be a metal oxide, preferably Silicon Dioxide.

According to a further preferred aspect, etching the first cavity into the first semiconductor substrate and etching the second cavity into the second semiconductor substrate each comprise: growing a first passivation layer on the semiconductor substrate; applying a resist coating to the first passivation layer; performing a lithography and developing step to selectively remove the resist coating; performing a first etching step to selectively remove the first passivation layer; stripping the resist coating from the first passivation layer; performing isotropic semiconductor etching to selectively remove a layer of the semiconductor substrate; stripping the first passivation layer; and growing a second passivation layer. A light sensitive film, primarily a resist layer or resist coating, is coated on top of the wafer. In some processes, the resist may serve as a mask to cover certain areas. In this case there is no transfer of the patterned resist layer into the layer beneath. (Photo-Lithography refers to a process used in microfabrication to pattern parts of a thin film or the bulk of a substrate.) A geometric pattern is transferred from a photomask to a light-sensitive chemical "photoresist", or simply "resist", on the substrate by using, e.g., light. In a developing step, the remaining resist is solidified. There are several ways to remove (or "strip") the resist coating. These involve dissolving the resist, e.g., in acetone. The resist coating may also be removed by oxygen plasma stripping. In a similar manner, the passivation layer may be stripped or removed as well.

According to a further preferred aspect, said growing a passivation layer comprises thermally oxidising the semiconductor substrate such that the passivation layer comprises an oxide layer. Preferably, a thin layer of oxide (e.g., Silicon Dioxide) is produced on the surface of the semiconductor substrates by means of thermal oxidation. Thermal oxidation implies forcing an oxidizing agent to diffuse into the substrate at high temperatures (e.g., 800° C. to 1200° C.) and react with it.

According to a further preferred aspect, the first and second semiconductor substrates comprise Silicon. The process flows shown herein refer to high resistivity monocrystalline Silicon wafers. However, by appropriate modifications to the passivation layers and the etching chemistry, the general principles can be easily modified to use semi-insulating monocrystalline Gallium Arsenide wafers or other semiconductor substrates. For instance, when using alternative substrate materials such as Magnesium Titanate ($Mg_2TiO_4$ and $MgTiO_3$) or Forsterite ($Mg_2SiO_4$), etching may be performed by using a mixture of Hydrofluoric Acid, Nitric Acid, and Acetic Acid.

According to a further preferred aspect, said isotropic semiconductor etching comprises using Xenon Difluoride ($XeF_2$) and/or using Sulfur hexafluoride ($SF_6$)/Oxygen ($O_2$) plasma etching. Xenon Difluoride ($XeF_2$) is typically used as an isotropic gaseous etchant for Silicon. An advantage of using $XeF_2$ is that it has a relatively high etch rate. Ion bombardment or external energy sources are not required in order to etch Silicon. Plasma etching involves directing a stream of plasma (here: an appropriate mixture of $SF_6$ and $O_2$) at the semiconductor substrate.

According to a further preferred aspect, said first etching step comprises an anisotropic etching step, and wherein said growing a first passivation layer comprises thermally oxidising the semiconductor substrate such that the first passivation layer comprises a first oxidation layer; and/or applying low-stress low-pressure chemical vapour deposition to the semiconductor substrate such that the first passivation layer comprises a nitride layer. Preferably, a thin layer of oxide (e.g., Silicon Dioxide) is produced on the surface of the semiconductor substrates by means of thermal oxidation. Thermal oxidation implies forcing an oxidizing agent to diffuse into the substrate at high temperatures (e.g., 800° C. to 1200° C.) and react with it. By employing Chemical vapor deposition a high-purity, high-performance thin film may be deposited on the semiconductor substrate. At sub-atmospheric pressures (low-pressure CVD), unwanted gas-phase reactions tend to be reduced and film uniformity across the semiconductor substrate is improved. The nitride layer may, e.g., be a Silicon nitride layer.

According to a further preferred aspect, said depositing a ferrite layer into the cavity comprises: arc plasma spraying of the ferrite layer in powder form; and/or performing wet chemical deposition of the ferrite layer. The ferrite layer may be arc plasma sprayed in powder form onto the cavity. In that case, the ferrite powder is injected into an arc gas stream where it melts and/or softens and is propelled toward the cavity of the semiconductor substrate. Arc plasma spraying permits melting and depositing many high melting temperature materials. Alternatively, the ferrite layer may be filled into the cavity by means of wet chemical deposition.

According to a further preferred aspect, said depositing a ferrite layer into the cavity further comprises: annealing of the ferrite layer; chemical mechanical polishing of the ferrite layer and/or hot phosphoric acid wet etching of the ferrite layer. Chemical mechanical polishing comprises smoothing the ferrite layer surface by combining of chemical and mechanical forces. In other words, the ferrite layer surface is planarized by chemical mechanical polishing. Optionally, phosphoric acid may be used as a wet etching agent in order to smoothen the ferrite layer surface. In particular, chemical mechanical polishing and/or hot phosphoric acid wet etching of the ferrite layer is performed prior to annealing of the ferrite layer. Optionally, chemical mechanical polishing and/or hot phosphoric acid wet etching of the ferrite layer is performed after annealing of the ferrite layer.

According to a further preferred aspect, attaching the first surface of the first semiconductor substrate to the second surface of the second semiconductor substrate comprises, for at least one semiconductor substrate of the first and second semiconductor substrates: applying a resist coating to a surface of the semiconductor substrate comprising the first or second cavity; performing a lithography and developing step to selectively remove the resist coating; performing a first etching step to selectively remove at least a part of the passivation layer; stripping the resist coating from the surface of the semiconductor substrate; assembling the first and second semiconductor substrates such that the respective first and second surfaces face each other.

According to a further preferred aspect, selectively removing at least a part of the passivation layer comprises thinning down the passivation layer in selected parts.

According to a further preferred aspect, the method further comprises the steps of chemical mechanical polishing of the first surface of the first semiconductor substrate; applying a second resist coating; performing a lithography and developing step to selectively remove the second resist coating; and heating the assembled structure comprising the first and second semiconductor substrates.

According to a further preferred aspect, the method further comprises the steps of depositing a gold and adhesion layer on the second surface of the second semiconductor substrate; etching the gold and adhesion layer; and stripping the second resist coating; wherein said heating the assembled structure comprises heating the assembled structure to create eutectic Gold:Silicon bonds. Eutectic bonding or eutectic soldering bears the advantage that the eutectic temperature can be much lower than the respective melting temperatures of Gold and Silicon. Further, by eutectically bonding the first and second semiconductor substrates, hermetically sealed packages comprising electrical interconnections are produced within a single process. Preferably, the adhesion layer comprises e.g. Chrome, TiW, TiN, etc. According to this embodiment, eutectic bonding is performed using an etching step, where the gold and adhesion layer is removed to expose the deposited ferrite layer.

According to a further preferred aspect, the method further comprises the steps of depositing a gold and adhesion layer on the second resist coating and on the second surface of the second semiconductor substrate; and lifting off the second resist coating; wherein said heating the assembled structure comprises heating the assembled structure to create eutectic Gold:Silicon bonds. Eutectic bonding or eutectic soldering bears the advantage that the eutectic temperature can be much lower than the respective melting temperatures of Gold and Silicon. Further, by eutectically bonding the first and second semiconductor substrates, hermetically sealed packages comprising electrical interconnections are produced within a single process. Preferably, the adhesion layer comprises e.g. Chrome, TiW, TiN, etc. According to this embodiment, eutectic bonding is performed using a liftoff step, where the second resist coating is lifted off in order to remove the gold and adhesion layer from the surface of the deposited ferrite layer.

According to a further preferred aspect, the method further comprises the steps of applying a second resist coating; performing a lithography and developing step to selectively remove the second resist coating; and applying heat and pressure to the assembled structure comprising the first and second semiconductor substrates. According to this embodiment, the first and second semiconductor substrates are bonded by applying thermocompression bonding.

According to a further preferred aspect, the method further comprises the steps of depositing a gold and adhesion layer on the respective first or second surface, wherein said applying a second resist coating comprises applying a second resist coating to the gold and adhesion layer; and etching the gold and adhesion layer. The method further comprises the step of stripping of the second resist coating. Said applying heat and pressure to the assembled structure comprises applying heat and pressure to the assembled structure to create Gold:Gold bonds. Here, two Gold layers are brought into atomic contact by applying pressure and heat simultaneously. An advantage of Gold/Gold thermocompression bonding relates to the fact that no further steps are required to achieve the bonding between first and second semiconductor substrates. According to this embodiment, Gold/Gold thermocompression bonding is performed using an etching step, where the gold and adhesion layer is removed to expose the deposited ferrite layer.

According to a further preferred aspect, the method further comprises the steps of depositing a gold and adhesion layer on the second resist coating and on the respective first or second surface, wherein said applying a second resist coating comprises applying a second resist coating to the gold and adhesion layer; and lifting off the second resist coating; wherein said applying heat and pressure to the assembled structure comprises applying heat and pressure to the assembled structure to create Gold:Gold bonds. Here, two Gold layers are brought into atomic contact by applying pressure and heat simultaneously. An advantage of Gold/Gold thermocompression bonding relates to the fact that no further steps are required to achieve the bonding between first and second semiconductor substrates. According to this embodiment, Gold/Gold thermocompression bonding is performed using a liftoff step, where the second resist coating is lifted off in order to remove the gold and adhesion layer from the surface of the deposited ferrite layer.

According to a further preferred aspect, the method further comprises applying a glue layer on the respective first or second surface; and curing the glue layer. According to this embodiment, the first and second semiconductor substrates are bonded together by adhesive bonding. Namely, an intermediate glue layer is applied to at least one of the semiconductor substrate surfaces. One advantage of adhesive bonding resides in the relatively low bonding temperature. Further, applying an electric voltage and current is not necessary.

Alternative substrate materials (into which the moulds are etched) could include Magnesium Titanate ($Mg_2TiO_4$ and $MgTiO_3$) and Forsterite ($Mg_2SiO_4$) to be etched with a mixture of Hydrofluoric Acid, Nitric Acid, and Acetic Acid.

In a further aspect of the invention a phase shifting device, preferably for manipulating radiation with frequencies above 1 GHz, is provided. The phase shifting device comprises: a semiconductor substrate; and a ferrite rod; wherein the ferrite rod is integrated in the semiconductor substrate.

According to a further preferred aspect of the invention, the phase shifting device comprises: a first semiconductor substrate and a second semiconductor substrate; and a ferrite rod; wherein the ferrite rod is integrated in at least one of the layers of the first and second semiconductor substrates.

In a further aspect of the invention, there is provided a ferrite rod. The ferrite rod of the invention aims to overcome many of these reliability issues that currently challenge the acceptance and usage of radio frequency (RF) micro-electromechanical system (MEMS) devices for challenging environments such as space by removing all moving parts and relying upon materials and a mode of device operation that are already space qualified and provide a means of controlling the operating frequency of a microwave/millimeter-wave device by providing a variable terminating impedance (adjustable in phase and/or magnitude). The device is fabricated and assembled using standard semiconductor process technologies (photolithography, anisotropic and isotropic etching, thin-film metallisation, wafer sawing, die and wafer bonding) which provide the means for batch production and repeatability together with an extremely high level of precision in the manufactured device dimensions and hence operating frequency and tuning range. The device has no moving parts and operates by providing an adjustable phase shifter ahead of a high reflection coefficient (low loss) fixed position short-circuit. Two co-located shunt and series adjustable short-circuit stubs, also referred to as an E-H tuner, can also be produced. They provide the ability to generate any complex reflection coefficient found on the Smith chart. The device may be integrated together with high Quality factor cavity resonators forming a frequency agile high selectivity filter as well as other devices. Use of the device together with a high Quality factor micromachined cavity resonator and an active (amplifying) element enables the production of ultra-low phase noise tuneable oscillators. In all examples, including the E-H tuner, can be fabricated in a planar circuit geometry. The phase shifting element can be combined with waveguide slot antennas to provide beamsteering as described by Reggia F, Spencer E G (1957), *A New Technique in Ferrite Phase Shifting for Beam Scanning of Microwave Antennas*, Proceedings of the IRE, Vol 45 November, 1510-1517.

It shall be understood that the method of manufacturing a ferrite rod of claim 1, the phase shifting device of claim 14, and the ferrite rod of claim 15 have similar and/or identical preferred embodiments as defined in the dependent claims.

It shall be understood that a preferred embodiment of the invention can also be any combination of the dependent claims or above embodiments with the respective independent claim.

These and other aspects of the invention will be apparent from and elucidated with reference to the embodiments described hereinafter.

BRIEF DESCRIPTION OF THE DRAWINGS

In the following drawings:

FIGS. 1A-1I show schematically and exemplarily an embodiment of isotropic etching of half cylinder moulds in a Silicon wafer surface, FIGS. 2A-2I show schematically and exemplarily another embodiment of isotropic etching of half cylinder "moulds" in the Silicon wafer surface, FIGS. 4A-4H and FIGS. 5A-5F show schematically and exemplarily an embodiment of a eutectic bonding process flow using etching, FIGS. 6A-6H and FIGS. 7A-7E show schematically and exemplarily an embodiment of a eutectic bonding process flow using liftoff, FIGS. 16A-16J and 17A-17B show schematically and exemplarily an embodiment of building a trapezoidal waveguide, FIG. 17C shows schematically and exemplarily an embodiment of building a hexagonal waveguide.

DETAILED DESCRIPTION OF EMBODIMENTS

Figure 3A:
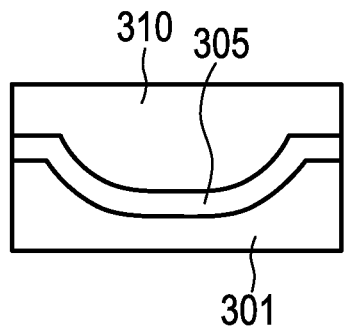
FIGS. 3A-3E show schematically and exemplarily an embodiment of processing the Silicon wafers after a ferrite layer has been deposited therein.

As the frequency of operation of a device increases, so the physical size of the ferrite element it employs must shrink in order to preserve the desired relationship between physical size and the operating wavelength. Barnes C E (1961), *Broad-Band Isolators and Variable Attenuators for Millimeter Wavelengths*, IRE Transactions on Microwave Theory and Techniques, MTT-9(6), 519-523, showed that for the production of broadband Faraday rotation devices (isolators, polarisers, circulators, switches) the diameter of the ferrite rod needs to be above a certain critical value so that the ferrite rod can act as a dielectric waveguide operating in the hybrid $HE_{11}$ mode where the Faraday rotation is essentially frequency independent. The maximum diameter of the rod needs to be well controlled to prevent the propagation of higher order modes as well. For the production of reciprocal phase-shifters of the so-called Reggia-Spencer, also referred to as the Diamond Ordnance Fuse Laboratory (DOFL) phase-shifter (see Reggia F, Spencer E G (1957), *A New Technique in Ferrite Phase Shifting for Beam Scanning of Microwave Antennas*, Proceedings of the IRE, Vol 45 November, 1510-1517), McCarter R S, Landry E F (1961), *Ka-Band Ferrite Phase Shifter*, IRE Transactions on Microwave Theory and Techniques, 9(3), 271, mention explicitly that Faraday rotation should be avoided which necessitates using even smaller ferrite rod diameters complicating the use of such devices at millimeter-wave and submillimeter wavelengths. McCarter and Landry used a 1.527 mm diameter ferrite rod for reciprocal phase-shifting at 35 GHz. They state that for rod diameters of 1.654 mm and larger that Faraday rotation was observed. By way of comparison, the Faraday rotation polarizer operating in the W-band (75-110 GHz) i.e. at over twice the frequency described by Erickson N R, Grosslein R M (2007), *A Low-Loss 74-110 GHz Faraday Polarization Rotator*, IEEE Transactions on Microwave Theory and Techniques, MTT-55(12), 2495-2501, used a 2.74 mm long, 1.22 mm diameter ferrite cylinder as the 45° Faraday rotation element.

Preferably the ferrite Faraday rotation rod/reciprocal phase-shifting rod is tapered to fine points at its ends and/or abutted by sections of dielectric forming impedance transformers to give a gradual, hence low reflection, impedance transformation from the air-filled waveguide section. Ideally such a dielectric transition taper should have both a low dielectric loss tangent to minimise losses as well as a real component of dielectric permittivity ($\in_r'$) that matches that of the ferrite rod forming the Faraday rotator/phase-shifter. Devices operating at millimeter-wave frequencies would use a ferrite with a high saturation magnetization, such as one of the substituted Lithium ferrites, Nickel Zinc ferrite, or Hexaferrite materials, with typically encountered values of $\in_r'$ between 12 and 13—see von Aulock W H ed. (1965), *Handbook of Microwave Ferrite Materials*, Academic Press—New York & London, 353-394 & 447-513. The dielectric transformer should have as close a value of $\in_r'$ to that of the magnetic material. The Faraday polarizer device built by Erickson and Grosslein (cf. Erickson N R, Grosslein R M (2007), *A Low-Loss 74-110 GHz Faraday Polarization Rotator*, IEEE Transactions on Microwave Theory and Techniques, MTT-55(12), 2495-2501) had a separately fabricated tapered ceramic dielectric transition and a quarter-wavelength ceramic plate glued to the ferrite rod to act as the impedance transformers from the air-filled waveguide to the ferrite Faraday rotation section. Similar dielectric impedance matching and tapering of the ferrite rod at its ends is used in the production of DOFL phase-shifters—see for example Reuss M L Jr. (1964), *A Study of a Ferrite Phase Shifter*, US Naval Research Laboratory, NRL Technical Report 6112, June 8. Production of cylindrical ferrite rods by conventional manufacturing methods requires expensive and laborious centre-less diamond grinding to give a smooth walled cylinder. This is then subject to further diamond shaping to taper the end sections of the rod. The time and hence costs and difficulty of doing this rise considerably with reducing ferrite dimensions. Each ferrite part must be individually ground and the dimensions and surface finish inspected prior to usage prior to inclusion into a device. It should be obvious that moving to higher operating frequencies will only increase the cost and difficulty of manufacturing the ferrite rods even further. Identical diamond machining techniques will be required for the production of the low loss ceramic dielectric impedance transformers.

FIGS. 1A to 12F show schematically and exemplarily cross-section sketches of several different processing flows for the production of tapered (quasi)cylindrical rods of magnetic material, for example ferromagnetic garnets, (spinel)ferrites, hexaferrites and antiferromagnets. These rods are for use in the fabrication of Faraday rotation devices as well as non-Faraday rotation phase-shifting (reciprocal and non-reciprocal) and absorption devices operating at microwave through submillimeter-wave frequencies. The process flows all show the use of high resistivity monocrystalline Silicon wafers. However, by appropriate modifications to the passivation layers and the etching chemistry, the general principles can be easily modified to use semi-insulating monocrystalline Gallium Arsenide wafers or other semiconductor substrates.

FIGS. 1A-1I and 2A-2I show two alternative routes to the isotropic etching of half cylinder "moulds" in the Silicon wafer surface into which ferrite material will be later deposited to form rods for use as microwave/(sub)millimeter-wave devices. FIGS. 1A-1I show an approach involving vapour phase isotropic etching of the Silicon wafer by Xenon Diflouride ($XeF_2$) as well as plasma etching using Sulphur Hexafluoride and Oxygen ($SF_6/O_2$). In both cases a thermally grown Silicon Dioxide hard mask is used to define the area of the Silicon wafer that will be etched to form the half cylinder "mould" for the ferrite rod. FIGS. 2A-2I illustrate an alternative approach to produce the same half cylinder shape in the Silicon wafer by wet etching in a mixture of Hydrofluoric, Nitric and Acetic acids. In this case a low pressure chemical vapour deposited Silicon Nitride film is used as a hard mask to define the areas of the wafer for etching. Typical etching rates and etch modifications, for example to improve the smoothness of the etched Silicon surface when using $XeF_2$, can be found in Kovacs G T A, Maluf N I, Petersen K E (1998), *Bulk Micromachining of Silicon*, Proceedings of the IEEE, 86(8), 1536-1551.

Referring to the process flow illustrated in FIGS. 1A-1I, FIG. 1A shows a Silicon wafer 101, which is subsequently subjected to thermal oxidation to arrive at the structure illustrated in FIG. 1B. As shown in FIG. 1B, a $SiO_2$ layer 102 is formed after thermally oxidizing Silicon wafer 101. Next, a resist coating 103 is applied to the $SiO_2$ layer as shown in FIG. 1C. After applying a lithography and developing step, a structure as shown in FIG. 1D is arrived at. Next, anisotropic $SiO_2$ etching is performed (cf. FIG. 1E) and the resist 103 is stripped such that the resulting structure is the one shown in FIG. 1F. An isotropic Si etching step is performed using $XeF_2$ or $SF_6/O_2$ plasma etching (shown in FIG. 1G). In a subsequent step, the remaining $SiO_2$ is stripped (FIG. 1H). A further thermal oxidation step yields the structure shown in FIG. 1I, where a $SiO_2$ layer 105 is shown. Next, as described herein below, one may choose to perform Arc Plasma Spray deposition of a ferrite or to perform wet chemical ferrite deposition.

Referring to the process flow illustrated in FIGS. 2A-2I, FIG. 2A shows a Silicon wafer 201, on which a Silicon Nitride layer 204 is grown, e.g., by low-stress low-pressure chemical vapour deposition (LPCVD), to arrive at the structure illustrated in FIG. 2B. Next, a resist coating 203 is applied to the SiN layer as shown in FIG. 2C. After applying a lithography and developing step, a structure as shown in FIG. 2D is arrived at. Next, Silicon Nitride etching is performed (cf. FIG. 2E) and the resist 203 is stripped such that the resulting structure is the one shown in FIG. 2F. An isotropic Si etching step is performed, e.g., using $HF/HNO_3$ with water or acetic acid (shown in FIG. 2G). In a subsequent step, the remaining Silicon Nitride is stripped (FIG. 2H). A thermal oxidation step yields the structure shown in FIG. 2I, where a $SiO_2$ layer 205 is shown. Next, as described herein below, one may choose to perform Arc Plasma Spray deposition of a ferrite or to perform wet chemical ferrite deposition.

Regardless of the method of isotropic Silicon etching used, FIGS. 13A-13D show the shape of the opening in the hard mask required for the isotropic Silicon etching to form half cylinders that taper to points at the ends.

Figure 13A:
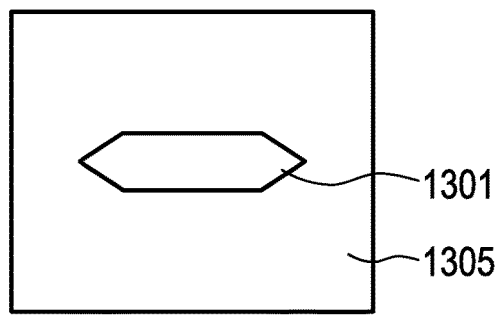
FIGS. 13A-13D shows schematically and exemplarily the shape of the opening in the hard mask required for the isotropic Silicon etching to form half cylinders that taper to points at the ends.
Figure 13B:
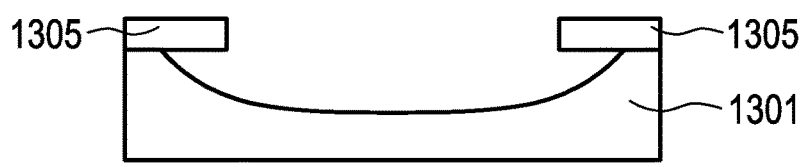
Figure 13C:
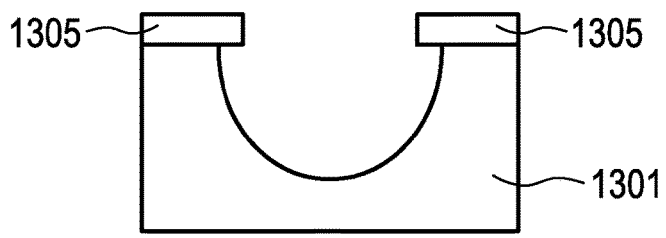
Figure 13D:
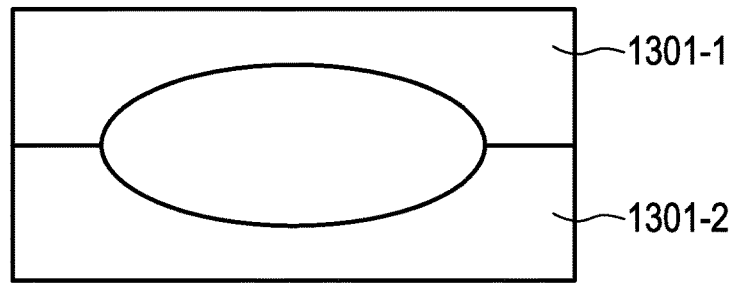

FIG. 13A illustrates a top view of the Silicon wafer prior to isotropic etching, where a hardmask 1305 exposes a selected portion of Silicon 1301. FIG. 13B illustrates a side view of the Silicon wafer after isotropic etching. FIG. 13C illustrates the end-on cross section of the Silicon wafer after isotropic etching. Two wafers 1301-1, 1301-2 are processed such that—when aligned together—they yield two cylinders tapered to points (i.e., cones) at either end, as illustrated in FIG. 13D.

Having fabricated the half cylinder "moulds" by either of the two isotropic Silicon etching process flows, the magnetic material 310 is deposited into the "mould" (cf. FIG. 3A). Two approaches specifically named herein are Arc Plasma Spraying (APS) of the magnetic (ferrite) material 310 in powder form and wet chemical deposition. Work by Babitt R W (1972), *Arc Plasma Deposition of Nickel Zinc Ferrites*, Research and Development Technical Report ECOM-3597, United States Army Electronics Command—Fort Monmouth N.J. USA; Babbitt R W (1976), *Arc Plasma Fabrication of Ferrite-Dielectric Composites*, American Ceramic Society Bulletin, June 1976, 566-568; Babitt R W, Stern R A (1979), *Fabrication and Performance of Ferrites Phase Shifters for Millimeter Frequencies*, IEEE Transactions on Magnetics, MAG-15(6), 1744-1746; Kaelberer R E, White G O, Patton C E (1977), *Microwave Properties of Arc Plasma Sprayed Lithium Ferrites*, Journal de Physique, Colloque C1 supplement 4 tome 38, C1-255, has shown that device quality layers up to 1.018 mm (0.04 inches) thick can be APS deposited onto a heated substrate. A method of ferrite rod production is described using pairs of micromachined Silicon wafers. Hence a single approximately 1.0 mm thick APS deposited ferrite layer 310 enables, using two such coated wafers, the production of rods with a diameter of 2.0 mm or more. In the form of actual device dimensions given in the previous section, the production of rods with such dimensions would enable the production of devices operating from below 30 GHz and upwards in frequency. Preferably, the substrate used for APS ferrite deposition has a high melting point, sufficient to withstand the post deposition ferrite annealing at temperatures of approximately 1000° C. and higher, necessary to obtain the desired magnetic properties. Monocrystalline Silicon wafers, having a melting point of 1414° C., meet such a requirement. Appropriate APS processing conditions such as ferrite powder preparation methodology, particle size, the type (Argon, Nitrogen, other) and flow rate of the arc gas, spraying distance to the Silicon wafer, temperature of the wafer during spraying and the annealing temperature, time and atmosphere are all factors to consider, see Babitt R W (1972), *Arc Plasma Deposition of Nickel Zinc Ferrites*, Research and Development Technical Report ECOM-3597, United States Army Electronics Command—Fort Monmouth N.J. USA.

Figure 3B:
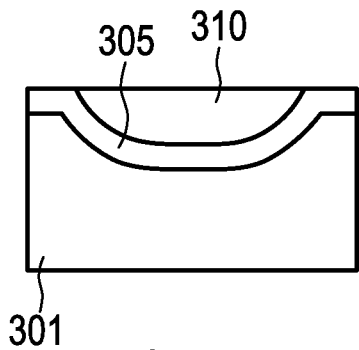

As another method of ferrite deposition, wet chemical processing can be used to build up layers of ferrite material 310 in the half cylinder "moulds". Wade W, Collins T, Malinofsky W W, Skudera W(1963), *Chemically Deposited Thin Ferrite Films*, Journal of Applied Physics, 34(4)—Part 2, 1219-1220; Wade Jnr W L, Collins T, Skudera Jnr W J, Stern R (1965), *Chemically-Deposited Thin Ferrite Films*, IEEE Transactions on Parts, Materials and Packaging, PMP-1(3), 26-31 describe a suitable method of deposition using liquid Nitrates precursors mixed in the appropriate stoichiometric ratios of the desired final ferrite material and diluted with methyl alcohol. The resulting solutions can then be deposited onto the thermally oxidised Silicon wafer in a thin-film. Due to the half cylinder shape of the isotropically etched "mould" in the wafer it may be preferable to spray coat the solution onto the wafer rather than spin coating or dip coating. Following wafer coating with the stoichiometric Nitrate solution an initial heat treatment of the wafer, according to Wade W, Collins T, Malinofsky W W, Skudera W (1963), *Chemically Deposited Thin Ferrite Films*, Journal of Applied Physics, 34(4)—Part 2, 1219-1220; Wade Jnr W L, Collins T, Skudera Jnr W J, Stern R (1965), *Chemically-Deposited Thin Ferrite Films*, IEEE Transactions on Parts, Materials and Packaging, PMP-1(3), 26-31, of between 400 and 700° C., converts the Nitrates to Oxides. The coating and oxidation procedure is then repeated until the desired ferrite layer thickness has been achieved. At this point the Silicon wafer with its metal oxide coating is then annealed at high temperature, between 900 and 1200° C., in an atmosphere appropriate to the final desired material (for example air, pure Oxygen, Nitrogen, etc.) for a number of hours. An exact set of process conditions is not specified here—optimum conditions will be ferrite material specific. Following the high temperature annealing, the metal oxides react to form the final ferrite material 310. A suitable alternative, alcoholic sol-gel, process for Nickel Zinc ferrite growth on thermally oxidised Silicon wafers has been demonstrated by van de Leest R E, Roozeboom F (2002), *Nickel-zinc ferrite films by rapid thermal processing of sol-gel precursors*, Applied Surface Science, 187, 68-74. This approach has the advantage that the conversion of the precursor film can be done selectively by exposure to ultra-violet light as an alternative to thermal annealing either in a conventional furnace or by rapid thermal processing. The non ultra-violet light exposed film can be subsequently removed from the wafer surface by an acid-ethanol solution. By using an appropriate masking material the ferrite deposition could be confined purely to the half cylinder "moulds" in the Silicon wafer surface. This is an attractive alternative to the blanket deposition of ferrite material 310 across the whole wafer surface which would then require planarization as shown in FIGS. 3B and 3E.

It should be noted that other ferrite deposition methods such as chemical vapour deposition, sputtering, pulsed laser ablation, etc., are not mentioned herein but are not specifically excluded by their omission and could also be attempted.

Figure 3D:
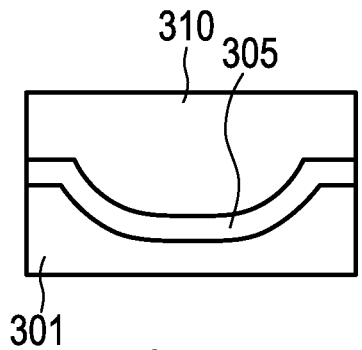

Following deposition of a ferrite 310 (cf. FIG. 3A) the half cylinder "mould" in the Silicon wafer 301 will be completely filled by the ferrite materials 310 and, in addition, there will be unwanted ferrite deposited on the flat non etched areas of the wafer 301. This extra ferrite must be removed (planarization) leaving a flat wafer surface with only the half cylinder "mould" filled. Two routes to achieve this are illustrated by FIGS. 3A-3E. The first option (FIGS. 3A-3D-3E) involves first annealing the entirety of the deposited ferrite material 310 with temperature, time and annealing atmosphere to be optimised according to the specific material deposited (FIG. 3D). This is then followed by (chemical) mechanical polishing and/or wet etching of the ferrite material 310 using hot Phosphoric acid so as to planarise the devices back to the level of the thermally oxidised Silicon wafer surface as show in FIG. 3E—see Carter J L, Edwards Jr. E V, Reingold I (1959), *Ferrite Sphere Grinding Technique, Review of Scientific Instruments,* 30, 946-947, Pierce A L (1961), *Polishing Technique for Garnet Spheres*, IRE Transactions on Microwave Theory and Techniques. MTT-9(3), 266-267 and Basterfield J (1969), *The chemical polishing of yttrium iron garnet*, British Journal of Applied Physics, 2(2), 1159-1162. Prior research into the effects of conventional abrasive grinding of ferrite materials has shown that the resulting surface damage and induced stress in the ferrite material has a negative effect upon the microwave losses, see Green J J, Patton C E, Sandy F (1968), *Microwave Properties of Partially Magnetized Ferrites*, Rome Air Development Centre, RADC-TR68-312, and will also result in changes to the material's magnetisation as well—see Knowles J E (1975), *The Origin of the Increase in Magnetic Loss Induced by Machining Ferrites*, IEEE Transactions on Magnetics, MAG-11(1), 44-50 and Broese van Groenou A (1975), *Grinding of Ferrites, Some Mechanical and Magnetic Aspects*, IEEE Transactions on Magnetics, MAG-11(5), 1446-1451. For these reasons, annealing of the ferrite 310 (transition from FIG. 3B to FIG. 3C and transition from FIG. 3A to FIG. 3D) after planarisation may be a preferable route to device fabrication as any undesirable changes to the material properties resulting from the (chemical) mechanical polishing and/or hot Phosphoric acid etching performed during chemical mechanical polishing and/or hot phosphoric acid wet etching of the ferrite 310 (transition between FIGS. 3A and 3B and between FIGS. 3D and 3E) can be rectified by the post-planarisation annealing. A second anneal of the ferrite material 310 could conceivably be employed following the chemical mechanical polishing and/or hot phosphoric acid wet etching of the ferrite 310 (transition between FIGS. 3D and 3E) as well. However, this would most likely cause a further thickening in the Silicon Dioxide layer 305 on the wafer 301 which would need to be etched or mechanically ground back in a subsequent step.

Figure 3C:
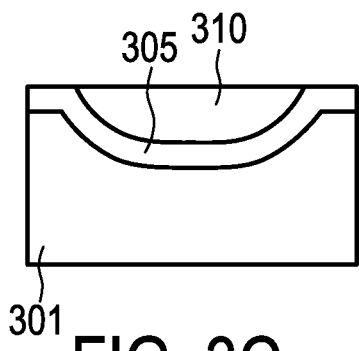
Figure 3E:
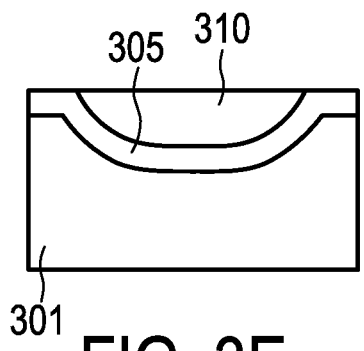

Having reached the structures shown in FIGS. 3C and 3E in the process flow, the Silicon wafer 301 contains a half cylinder (tapered to a point at its ends) of annealed magnetic material 310 that has been planarised while the rest of the wafer 301 has been passivated with a stable, low loss thermal Silicon Dioxide layer 305. At this point several different methods for the assembly of pairs of such wafers 301 to form solid cylindrical ferrite rods are considered. These can be divided into two main groups namely glueing and Gold-based wafer bonding which can itself be further subdivided into two approaches. These are Gold/Silicon eutectic bonding and Gold/Gold thermocompression bonding. In both cases, eutectic and thermocompression bonding, two further sub-process flows are presented according to whether the Gold and thin film(s) adhesion layer have been defined on the wafer surface by using the lift-off process or by etching. In total, this leads to five different process flows for the final assembly of the ferrite rods.

For eutectic bonding, using either lift-off (FIGS. 6 and 7) or etching (cf. FIGS. 4 and 5), the two wafers are processed slightly differently from each other resulting in a slightly asymmetric ferrite cylinder following wafer bonding. One of the wafers is subject to grinding/chemical mechanical polishing (cf. FIG. 4B) to remove a thin layer of ferrite 410 and thermal Silicon Dioxide 405 from the wafer 401-1. The second wafer 401-2 is subject to anisotropic etching of the thermal Silicon Dioxide film in all regions except immediately next to the ferrite half cylinder. This has the effect of reducing the height of the wafer slightly leaving the ferrite half cylinder and its thermal Silicon Dioxide 'liner' standing slightly proud of the wafer surface. This is done so that the subsequently deposited thin-film adhesion layer(s), for example Chromium, Niobium, Molybdenum, or Titanium Tungsten, and Gold layer used for the eutectic bonding is no higher than the level of the ferrite half cylinder's outermost surface (cf. FIGS. 5D and 7C). This means that when the two wafers are bonded together (cf. FIGS. 5E/5F and 7D/7E) there is no air-gap between the two ferrite half cylinders after wafer bonding. Without such processing the wafers would be eutectically bonded together but there would be no intimate contact between the two ferrite half cylinders.

Figure 4A:
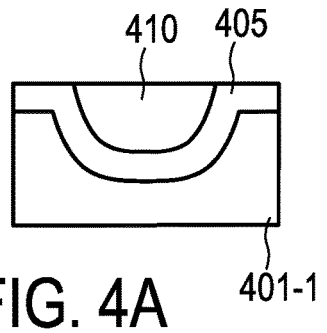
Figure 4B:
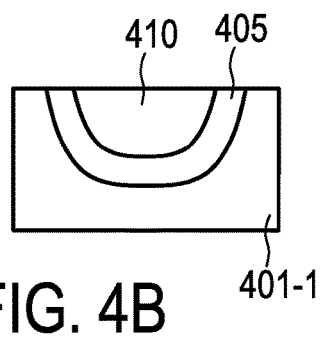
Figure 4C:
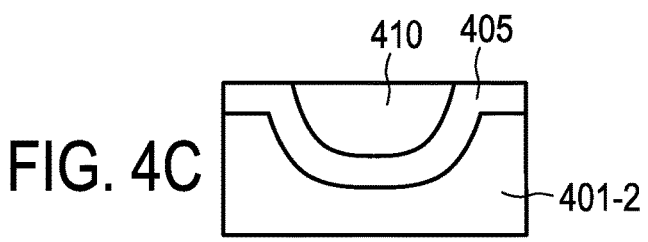
Figure 4D:
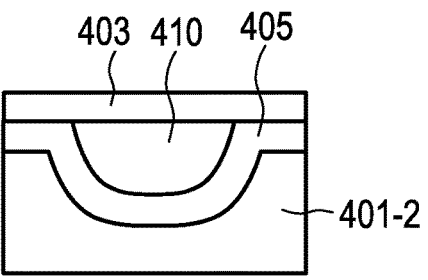
Figure 4E:
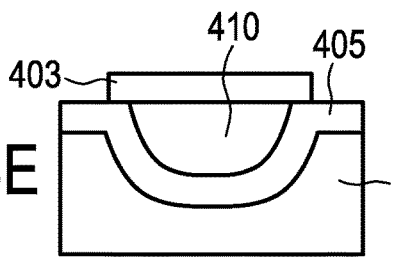
Figure 4F:
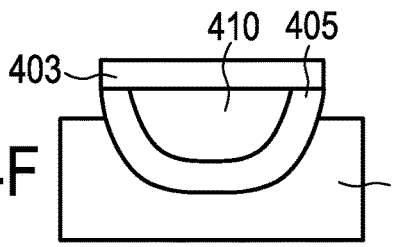
Figure 4G:
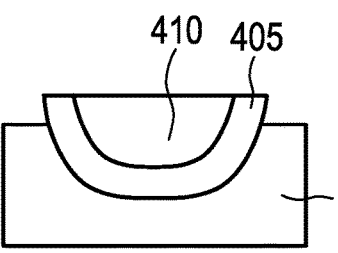
Figure 4H:
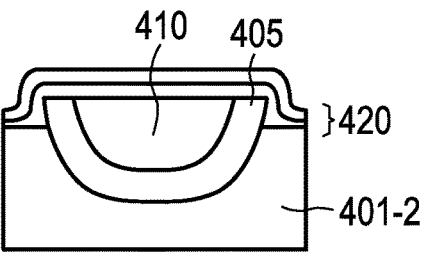

Referring to the eutectic bonding process flow using etching illustrated in FIGS. 4A-4H and FIGS. 5A-5F, FIG. 4A shows a first Silicon wafer 401-1 comprising a half cylinder (tapered to a point at its ends) of annealed magnetic material 410 that has been planarised while the rest of the wafer 401-1 has been passivated with a stable, low loss thermal Silicon Dioxide layer 405. A step of chemical mechanical polishing yields the structure shown in FIG. 4B. A second Silicon wafer 401-2 (shown in FIG. 4C), similar to the first Silicon wafer 401-1, comprises a half cylinder (tapered to a point at its ends) of annealed magnetic material 410 that has been planarised. The rest of the wafer 401-2 has been passivated with a stable, low loss thermal Silicon Dioxide layer 405. FIG. 4D shows Silicon wafer 401-2 after applying a resist coating 403. By subjecting the wafer to a lithography and developing step, the resist coating 403 is selectively removed as shown in FIG. 4E. Next, by anisotropic Silicon Dioxide etching, $SiO_2$ layer 405 is selectively removed at least in part as shown in FIG. 4F. Having arrived at the structure shown in FIG. 4F, resist coating 403 is stripped therefrom, see FIG. 4G. In a further step, gold and adhesion layers 420 are deposited on the wafer as explained herein above. A further resist coating 503 is applied to the wafer as shown in FIG. 5A. After having applied lithography and developing, resist coating 503 has been selectively removed as shown in FIG. 5B. By etching gold and adhesion layers 420, layers 420 are selectively removed as shown in FIG. 5C. In a further step illustrated by FIG. 5D, resist coating 503 is stripped from the wafer. The resulting structure is then assembled with wafer 401-2 (cf. FIG. 5E) and bonded together using Gold:Silicon eutectic bonding by heating (cf. FIG. 5F). As illustrated by FIG. 5F, Silicon wafers 401-1 and 401-2 are held together by eutectic Au:Si bonds 425.

It should be noted that passivation layer 405 is not necessarily completely removed from wafer 401-2 to the sides of the ferrite region 410 (see FIG. 4F). That is, although FIG. 4F shows no passivation layer 405 to the sides of ferrite region 410, a thin layer (not shown in FIG. 4F) may be left on wafer 401-2 also to the sides of ferrite region 410. A complete removal would leave bare Silicon 401-2 which would feature only a native Oxide (i.e., an extremely thin and not a reliable/stable passivation layer) onto which metallisation layer 420 would subsequently be deposited. Preferably, passivation layer 405 is merely thinned down to enable the subsequent metallisation layer 420 to be deposited such that metallisation layer 420 does not stand proud, i.e. above the level, of the ferrite region 410. That way, metallisation layer 420 is deposited onto a high quality and stable thermally grown Silicon Dioxide passivation layer 405.

A further potential advantage of this change is that the whole of the Silicon wafer is passivated, not just the ferrite-containing region. Accordingly, the thinning back of the Silicon after the two wafers are bonded together can be taken a step further than the 30 to 50 μm mentioned herein below. Thermally grown Silicon Dioxide is an excellent etch stop/hard mask for Tetramethyl Ammonium Hydroxide (TMAH). This means that the bonded wafers (forming a complete ferrite rod) can be first mechanically thinned down to approximately 30 to 50 μm. The wafers can then be placed in a bath of Tetramethyl Ammonium Hydroxide (TMAH) etchant which will chemically remove all of the rest of the Silicon wafer but cannot etch through the Silicon Dioxide passivation layer. Thus, the resulting device is basically only composed of the ferrite needle. While the Silicon region is lost for use as an impedance transformer, the whole ferrite insert is about as close to being composed solely of ferrite as possible which could be important if minimization of the size of the alignment notches in FIGS. 15G, 16J, 17B, 17C, and 22C is desired. This would also permit metallisation of the whole of the outside of the bonded ferrite rod structure to form a dielectric/ferrite waveguide of circular cross-section as would be needed for the construction of reciprocal dual mode latching phase-shifters and reciprocal rotary field non-latching phase shifters as described by Hord W E (1989), *Microwave and Millimeter-wave Ferrite Phase Shifters*, Microwave Journal State of the Art Supplement—September.

Regarding the Gold/Silicon eutectic bonding flow as shown in FIGS. 4A-5F, where one wafer is planarised (FIGS. 4A-4B), the magnetic material bearing wafers 401-1 and 401-2 might no longer be totally symmetrical, i.e., the ferrite rod might not be cylindrical anymore. As an alternative approach, both wafers 401-1 and 401-2 might be subjected to the steps shown in FIGS. 4C-4G (where wafer 401-1 does indeed have all $SiO_2$ removed by etching in the steps illustrated in FIGS. 4F and 4G). Then, provided that metallization layer 420 on wafer 401-2 is sufficiently thick enough to ensure contact, bonding to wafer 401-1 can be achieved without there being a gap between magnetic material layers 410. In this approach, metal layer 420 is higher than the level of magnetic material 410 in substrate 401-2 so as to be in contact with the Silicon of substrate 401-1. The two magnetic filled regions still contact each other without an airgap and there is metal/silicon contact for the bonding.

Figure 7A:
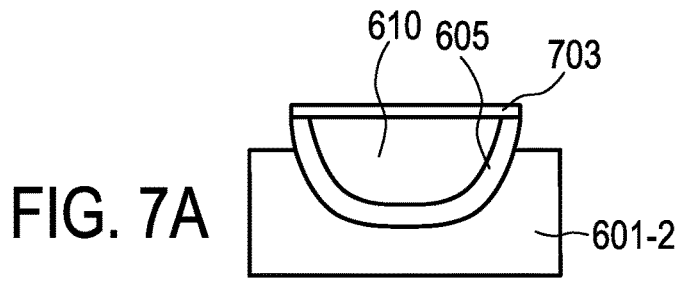
Figure 7B:
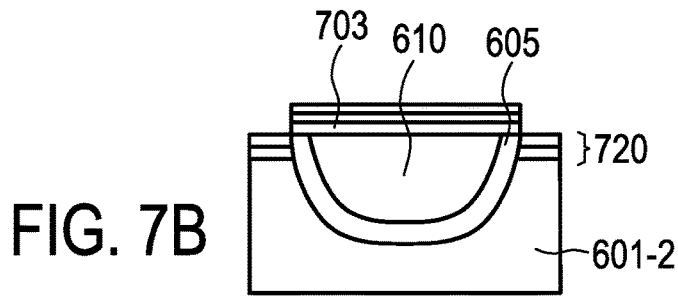
Figure 7C:
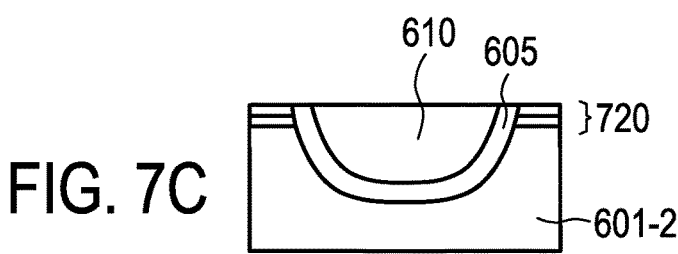
Figure 7D:
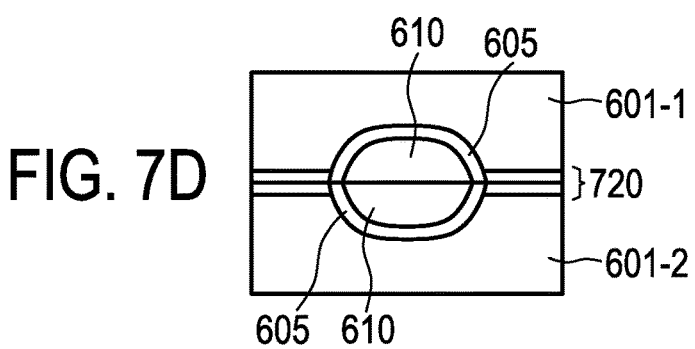
Figure 7E:
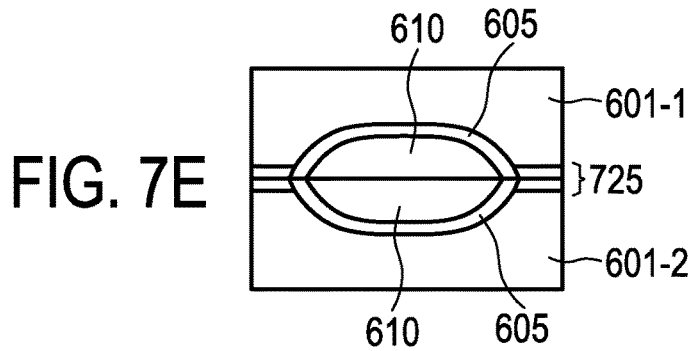

Referring to the eutectic bonding process flow using liftoff illustrated in FIGS. 6A-6H and FIGS. 7A-7E, FIG. 6A shows a first Silicon wafer 601-1 comprising a half cylinder (tapered to a point at its ends) of annealed magnetic material 610 that has been planarised while the rest of the wafer 601-1 has been passivated with a stable, low loss thermal Silicon Dioxide layer 605. A step of chemical mechanical polishing yields the structure shown in FIG. 6B. A second Silicon wafer 601-2 (shown in FIG. 6C) similar to the first Silicon wafer 601-1 comprises a half cylinder (tapered to a point at its ends) of annealed magnetic material 610 that has been planarised while the rest of the wafer 601-2 has been passivated with a stable, low loss thermal Silicon Dioxide layer 605. FIG. 6D shows Silicon wafer 601-2 after applying a resist coating 603. By subjecting the wafer to a lithography and developing step, the resist coating 603 is selectively removed as shown in FIG. 6E. Next, by anisotropic Silicon Dioxide etching, SiO₂ layer 605 is selectively removed as shown in FIG. 6F. Having arrived at the structure shown in FIG. 6F, resist coating 603 is stripped therefrom, see FIG. 6G. In a further step, a further resist coating 703 is deposited on the wafer as shown in FIG. 6H. After having applied lithography and developing, resist coating 703 has been selectively removed as shown in FIG. 7A. In a next step, gold and adhesion layers 720 are deposited on wafer 601-2 as shown in FIG. 7B. In a further step illustrated by FIG. 7C, resist coating 703 is lifted off to remove gold and adhesion layers 720 from the ferrite region. The resulting structure is then assembled with wafer 601-2 (cf. FIG. 7D) and bonded together using Gold:Silicon eutectic bonding by heating (cf. FIG. 7E). As illustrated by FIG. 7E, Silicon wafers 601-1 and 601-2 are held together by eutectic Au:Si bonds 725.

Again, it should be noted that passivation layer 605 is not necessarily completely removed from wafer 601-2 to the sides of the ferrite region 610. That is, although FIG. 6F shows no passivation layer 605 to the sides of ferrite region 610, a thin layer (not shown in FIG. 6F) may be left on wafer 601-2 also to the sides of ferrite region 610. Preferably, passivation layer 605 is merely thinned down to enable the subsequent metallisation layer 720 to be deposited such that metallisation layer 720 does not stand proud, i.e. above the level, of the ferrite region 610.

Regarding the Gold/Silicon eutectic bonding flow as shown in FIGS. 6A-7F, where one wafer is planarised (FIGS. 6A-6B), the magnetic material bearing wafers 601-1 and 601-2 might no longer be totally symmetrical, i.e., the ferrite rod might not be cylindrical anymore. As an alternative approach, both wafers 601-1 and 601-2 might be subjected to the steps shown in FIGS. 6C-6G (where wafer 601-1 does indeed have all SiO₂ removed by etching in the steps illustrated in FIGS. 6F and 6G). Then, provided that metallization layer 620 on wafer 601-2 is sufficiently thick enough to ensure contact, bonding to wafer 601-1 can be achieved without there being a gap between magnetic material layers 610. In this approach, metal layer 620 is higher than the level of magnetic material 610 in substrate 601-2 so as to be in contact with the Silicon of substrate 601-1. The two magnetic filled regions still contact each other without an airgap and there is metal/silicon contact for the bonding. With Gold/Gold thermocompression bonding (FIGS. 8-11), the two wafers (from FIG. 3C or 3E) are processed identically with anisotropic etching of the thermal Silicon Dioxide film 305, 405, 605 so that the Gold and adhesion layer(s) films 420, 720 on the two wafers can make contact with each other to permanently bond the wafers together without being higher than the outermost surfaces of the ferrite half cylinders, i.e., so that no air gap will exist between the ferrite regions 310, 410, 610.

Figure 8A:
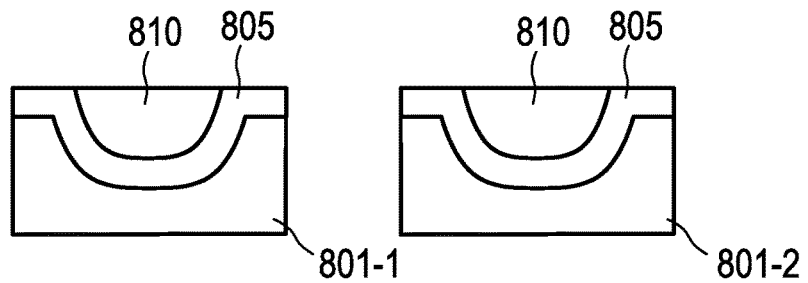
FIGS. 8A-8F and FIGS. 9A-9F show schematically and exemplarily an embodiment of a Gold/Gold thermocompression bonding process flow using etching.
Figure 8B:
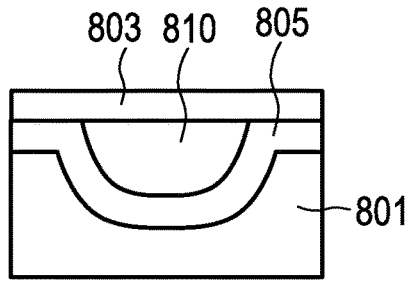
Figure 8C:
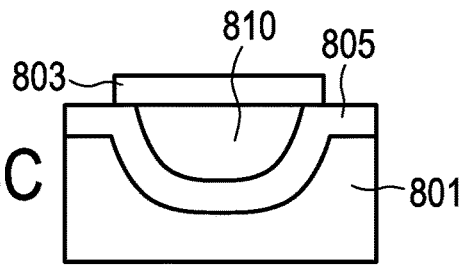
Figure 8D:
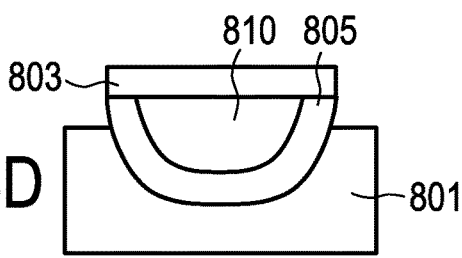
Figure 8E:
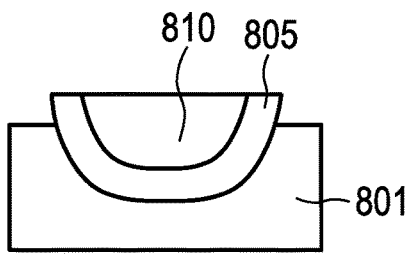
Figure 8F:
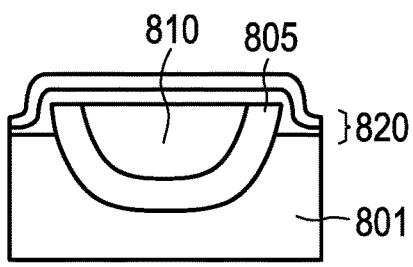
Figure 9A:
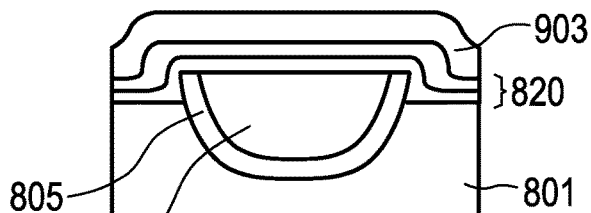
Figure 9B:
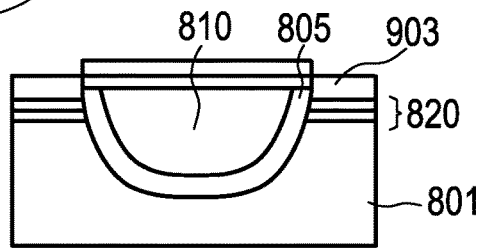
Figure 9C:
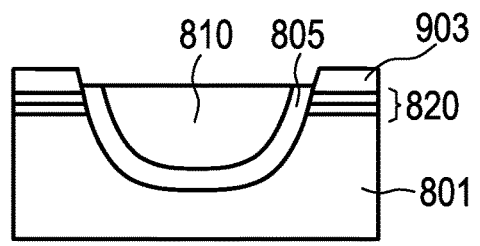
Figure 9D:
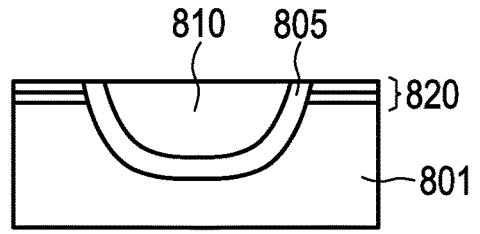
Figure 9E:
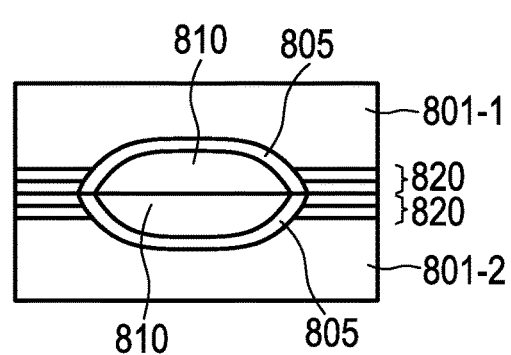
Figure 9F:
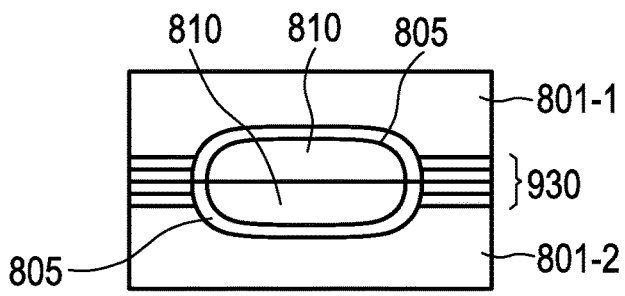

Referring to the Gold/Gold thermocompression bonding process flow using etching illustrated in FIGS. 8A-8F and FIGS. 9A-9F, FIG. 8A shows first and second Silicon wafers 801-1 and 801-2, both comprising a half cylinder (tapered to a point at its ends) of annealed magnetic material 810 that has been planarised while the rest of the wafers 801-1, 801-2 has been passivated with a stable, low loss thermal Silicon Dioxide layer 805. FIG. 8B shows one of Silicon wafers 801-1, 801-2 (henceforth referred to as Silicon wafer 801) after applying a resist coating 803. By subjecting the wafer to a lithography and developing step, the resist coating 803 is selectively removed as shown in FIG. 8C. Next, by anisotropic Silicon Dioxide etching, SiO₂ layer 805 is selectively removed as shown in FIG. 8D. Having arrived at the structure shown in FIG. 8D, resist coating 803 is stripped therefrom, see FIG. 8E. In a further step, gold and adhesion layers 820 are deposited on the wafer as explained herein above. A further resist coating 903 is applied to the wafer as shown in FIG. 9A. After having applied lithography and developing, resist coating 903 has been selectively removed as shown in FIG. 9B. By etching gold and adhesion layers 820, layers 820 are selectively removed as shown in FIG. 9C. In a further step illustrated by FIG. 9D, resist coating 903 is stripped from the wafer. Both wafers 801-1 and 801-2 are then assembled (cf. FIG. 9E) and bonded together by applying heat and pressure (cf. FIG. 9F). As illustrated by FIG. 9F, Silicon wafers 801-1 and 801-2 are held together by Au/Au wafer bonds 930.

Again, it should be noted that passivation layer 805 is not necessarily completely removed from wafer 801-2 to the sides of the ferrite region 810. That is, although FIG. 8D shows no passivation layer 805 to the sides of ferrite region 810, a thin layer (not shown in FIG. 8D) may be left on wafer 801-2 also to the sides of ferrite region 810. Preferably, passivation layer 805 is merely thinned down to enable the subsequent metallisation layer 820 to be deposited such that metallisation layer 820 does not stand proud, i.e. above the level, of the ferrite region 810.

Figure 10A:
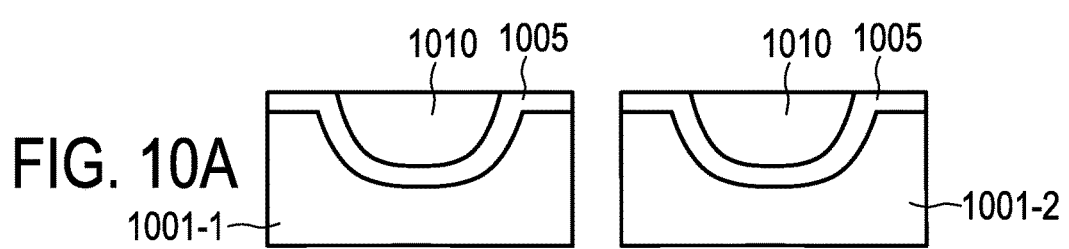
FIGS. 10A-10F and FIGS. 11A-11E show schematically and exemplarily an embodiment of a Gold/Gold thermocompression bonding process flow using liftoff, FIG. 12 show schematically and exemplarily an embodiment of a process flow of glueing the wafers together.
Figure 10B:
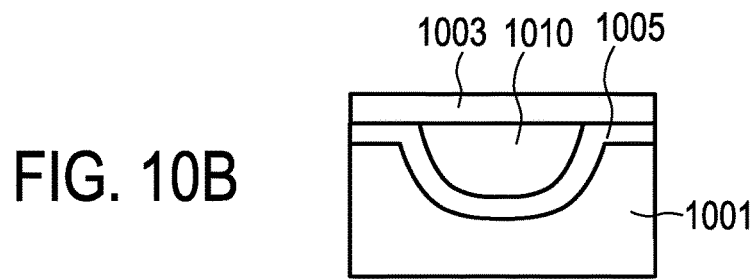
Figure 10C:
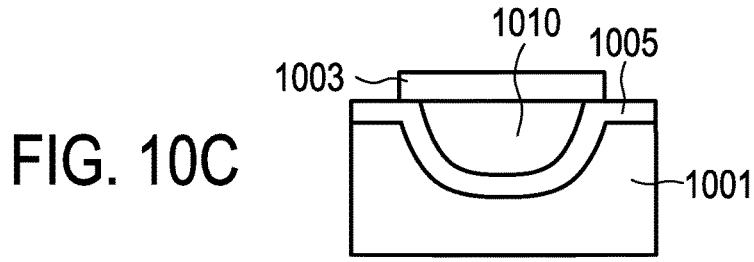
Figure 10D:
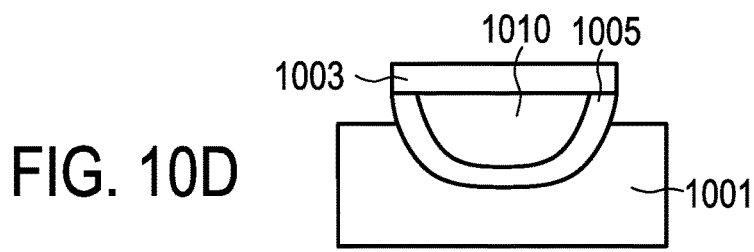
Figure 10E:
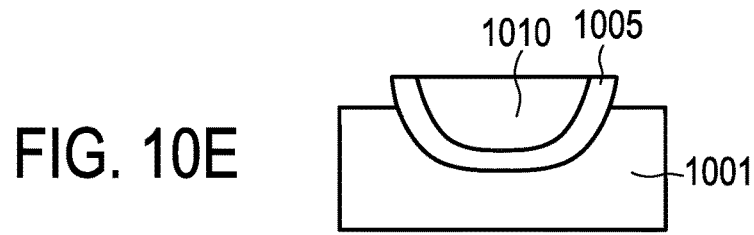
Figure 10F:
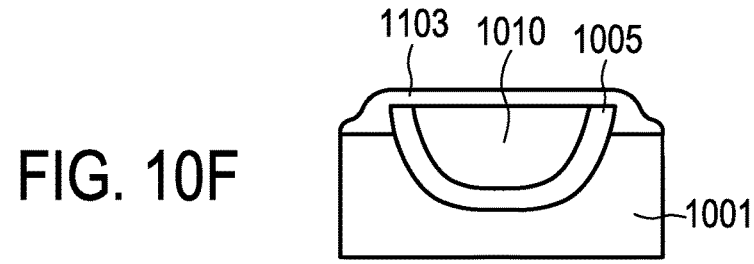
Figure 11A:
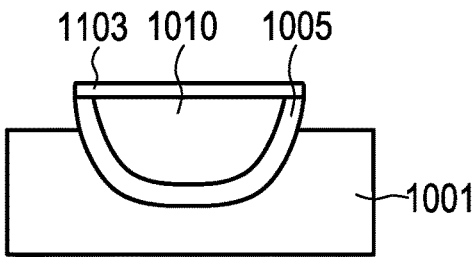
Figure 11B:
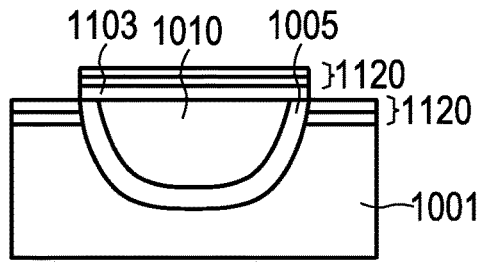
Figure 11C:
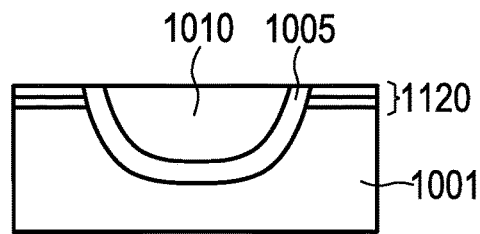
Figure 11D:
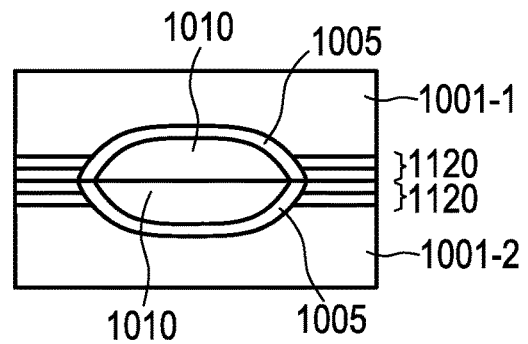
Figure 11E:
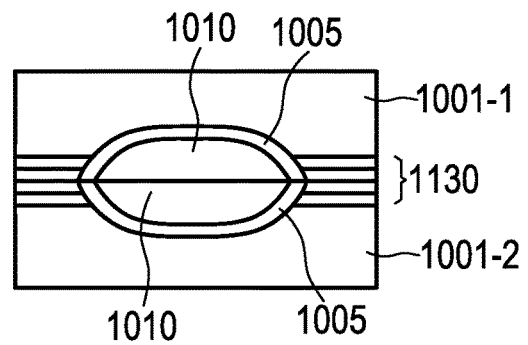

Referring to the Gold/Gold thermocompression bonding process flow using liftoff illustrated in FIGS. 10A-10F and FIGS. 11A-11E, FIG. 10A shows first and second Silicon wafers 1001-1 and 1001-2, both comprising a half cylinder (tapered to a point at its ends) of annealed magnetic material 1010 that has been planarised while the rest of the wafers 1001-1, 1001-2 has been passivated with a stable, low loss thermal Silicon Dioxide layer 1005. FIG. 10B shows one of Silicon wafers 1001-1, 1001-2 (henceforth referred to as Silicon wafer 1001) after applying a resist coating 1003. By subjecting the wafer to a lithography and developing step, the resist coating 1003 is selectively removed as shown in FIG. 10C. Next, by anisotropic Silicon Dioxide etching, SiO₂ layer 1005 is selectively removed as shown in FIG. 10D. Having arrived at the structure shown in FIG. 10D, resist coating 1003 is stripped therefrom, see FIG. 10E. In a further step, a further resist coating 1103 is deposited on the wafer as shown in FIG. 10F. After having applied lithography and developing, resist coating 1103 has been selectively removed as shown in FIG. 11A. In a next step, gold and adhesion layers 1120 are deposited on wafer 1001 as shown in FIG. 11B. In a further step illustrated by FIG. 11C, resist coating 1003 is lifted off to remove gold and adhesion layers 1120 from the ferrite region. Both wafers 1001-1 and 1001-2 are then assembled (cf. FIG. 11D) and bonded together using thermocompression binding (i.e., applying heat and pressure) (cf. FIG. 11F). As illustrated by FIG. 11F, Silicon wafers 1001-1 and 1001-2 are held together by Au/Au wafer bonds 1130.

Again, it should be noted that passivation layer 1005 is not necessarily completely removed from wafer 1001-2 to the sides of the ferrite region 1010. That is, although FIG. 10D shows no passivation layer 1005 to the sides of ferrite region 1010, a thin layer (not shown in FIG. 10D) may be left on wafer 1001-2 also to the sides of ferrite region 1010. Preferably, passivation layer 1005 is merely thinned down to enable the subsequent metallisation layer 1120 to be deposited such that metallisation layer 1120 does not stand proud, i.e. above the level, of the ferrite region 1010.

A similar back etching of the thermal Silicon Dioxide film 305, 405, 605, 805, 1005 on the wafer may be used to provide space to insert a glue layer (cf. FIGS. 12A-12F) for glueing together of the wafer pairs without introducing an air-gap between the ferrite half cylinders.

Figure 12A:
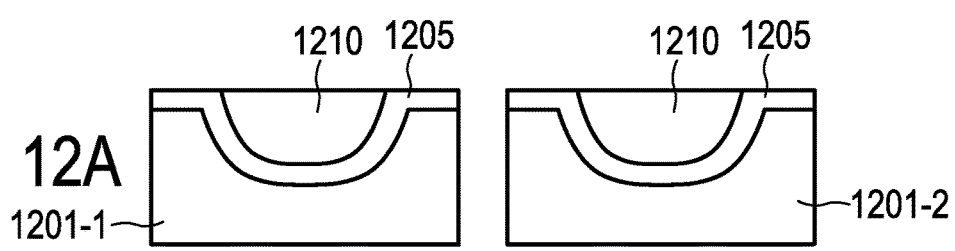
Figure 12B:
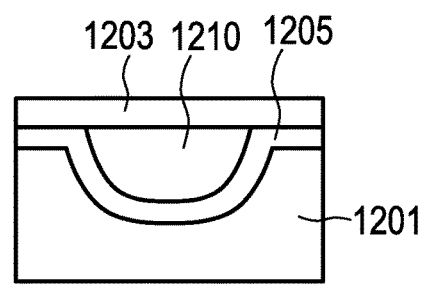
Figure 12C:
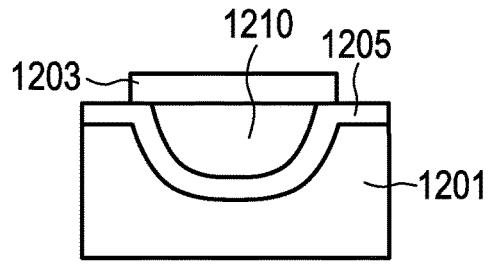
Figure 12D:
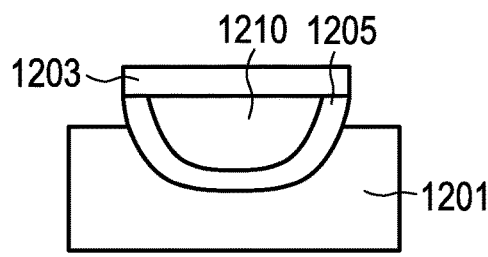
Figure 12E:
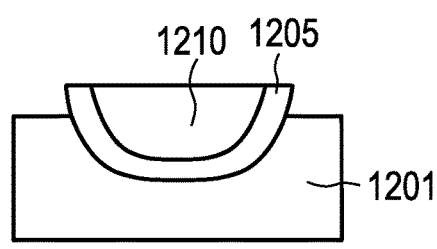
Figure 12F:
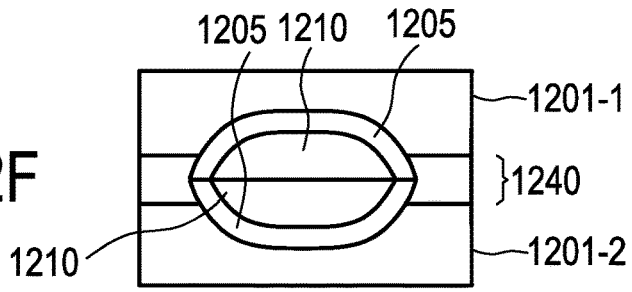

Referring to the process flow of glueing wafers together illustrated in FIGS. 12A-12F, FIG. 12A shows first and second Silicon wafers 1201-1 and 1201-2, both comprising a half cylinder (tapered to a point at its ends) of annealed magnetic material 1210 that has been planarised while the rest of the wafers 1201-1, 1201-2 has been passivated with a stable, low loss thermal Silicon Dioxide layer 1205. FIG. 12B shows one of Silicon wafers 1201-1, 1201-2 (henceforth referred to as Silicon wafer 1201) after applying a resist coating 1203. By subjecting the wafer to a lithography and developing step, the resist coating 1203 is selectively removed as shown in FIG. 12C. Next, by anisotropic Silicon Dioxide etching, $SiO_2$ layer 1205 is selectively removed as shown in FIG. 12D. Having arrived at the structure shown in FIG. 12D, resist coating 1203 is stripped therefrom, see FIG. 12E. Both wafers 1201-1 and 1201-2 are then assembled with a glue layer 1240, subsequent to which glue layer 1240 is cured (cf. FIG. 12F).

Figure 26:
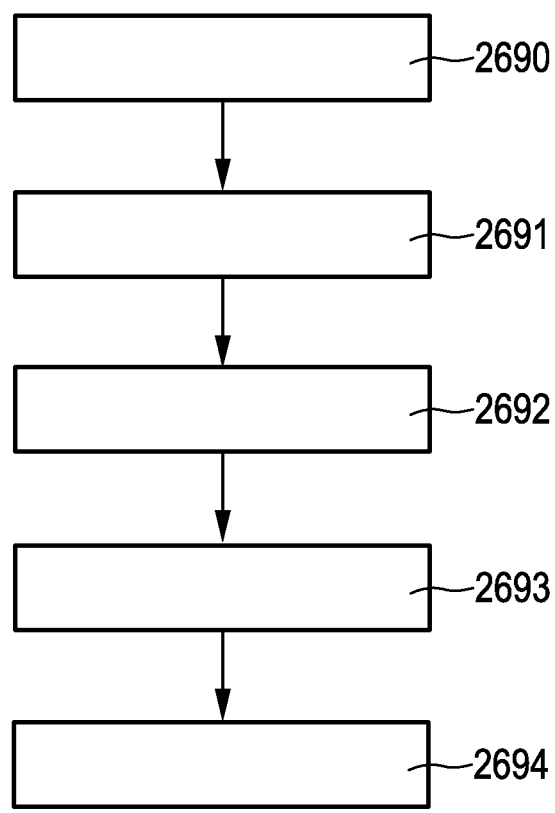
FIG. 26 shows schematically and exemplarily an embodiment of a method of manufacturing a ferrite rod.

FIG. 26 shows schematically and exemplarily an embodiment of a method of manufacturing a ferrite rod. The method comprises the following steps:

Step 2690 comprises etching a first cavity into a first surface of a first semiconductor substrate.

Step 2691 comprises depositing a first ferrite layer into the first cavity.

Step 2692 comprises etching a second cavity into a second surface of a second semiconductor substrate.

Step 2693 comprises depositing a second ferrite layer into the second cavity.

Step 2694 comprises attaching the first surface of the first semiconductor substrate to the second surface of the second semiconductor substrate such that the first ferrite layer contacts the second ferrite layer, wherein the first ferrite layer and the second ferrite layer form a ferrite rod.

After wafer bonding, by any of the previously described means, the resulting two Silicon wafer stack will be in the form shown in FIGS. 5F, 7E, 9F, 11E and 12F. The bonded wafer pair is then thinned by mechanically grinding away and/or chemically etching the Silicon both above and below the magnetic cylinder region until only the minimum required for structural device integrity and heat transfer remains. Grinding down to a minimum remaining Silicon thickness of 30 to 50 nm should be possible. Such values are reported in Lu J Q, Jindal A, Kwon Y, McMahon J J, Rasco M, Augur R, Cale T S, Gutmann R J (2003), *Evaluation Procedures for Wafer Bonding and Thinning of Interconnect Test Structures for 3D ICs*, IEEE International Interconnect Technology Conference (IITC)—San Francisco Calif. June 2-4, pages 74-76, referring to backgrinding of bonded Silicon wafers.

For certain devices, for example reciprocal and non-reciprocal phase-shifters and resonance isolators, a specific (design sensitive parameter) thickness of the enclosing/supporting monocrystalline Silicon wafer pair may be left in place around the magnetic material core to provide for optimum device operation due to concentration of the electromagnetic fields from the waveguide within the magnetic material as well as by improving the impedance match between the magnetic material filled region and the air-filled waveguide sections—see Button K J, Lax B (1962), *Microwave Ferrites and Ferrimagnetics*, McGraw-Hill Book Company Inc, 373-374 & 576-579. After thinning, the individual ferrite rods can be cut from the wafer using standard Silicon diamond wafer sawing technology and/or laser cutting. The dicing process can be used to introduce a tapering of the Silicon surrounding the tapered points of the ferrite rod to aid in impedance matching to the air-filled waveguide that the ferrite element will subsequently be mounted in.

For the production of Faraday rotation devices the presence of a lossy material immediately adjacent to the ferrite rod region due to the wafer bond should not have an adverse effect upon the device functionality and can in fact serve a useful purpose. The desired fundamental hybrid $HE_{11}$ dielectric rod waveguide mode propagating in the ferrite rod and subject to Faraday rotation should be well confined to the ferrite region and therefore unlikely to interact (and suffer loss) with the material of the wafer bond. Undesired higher order modes which will harm the desired device performance will be less well confined to the ferrite rod and will extend outwards into the wafer bond region. By deliberately introducing loss in the bond region for example by including electrically resistive particles into the glue of a glued wafer pair or by having a very thin Gold layer above a thick lossy adhesion layer (TiW) for eutectic or thermo-compression bonding the higher order modes can be attenuated to improve overall device operation and bandwidth. The production of a polysilicon film doped to produce a resistive layer next to the ferrite cylinder would also be a useful approach. All of the methods mentioned are similar in intent to the approach of Barnes C E (1961), *Broad-Band Isolators and Variable Attenuators for Millimeter Wavelengths*, IRE Transactions on Microwave Theory and Techniques, MTT-9(6), 519-523, who placed his Faraday rotation element inside a lossy carbon loaded plastic housing.

In the case of the (non)reciprocal phase-shifting and resonance absorption ferrite rod devices the same high level of field confinement to the ferrite rod will not be present. For this reason the location of any potentially lossy materials used for bonding the wafer pair together to form the cylindrical ferrite rod should be sufficiently far away from the ferrite material so as not to negatively impact the device operation.

In the following, example embodiments employing the ferrite rods for use in the production of frequency agile microwave devices are described.

An important functional element is a low loss adjustable short-circuit that is formed from a fixed position (non adjustable) short-circuited section of waveguide micromachined from a monocrystalline Silicon or compound semiconductor, for example Gallium Arsenide, wafer. A hard masking layer is deposited onto the substrate material followed by photolithography to define the outlines of the waveguide. The waveguide section is then anisotropically etched in the substrate using either a plasma-based process or using wet chemical etching with an appropriate etchant for example for Silicon, Potassium Hydroxide (KOH) or Tetramethyl Ammonium Hydroxide (TMAH) which results in a waveguide with characteristically sloped sidewalls. Following removal of the hard mask material (resistant to the etchant used), a high quality, pin-hole free insulating dielectric layer is deposited inside the etched waveguide section, for example Silicon Dioxide in the case of a Silicon substrate. A thin-film, high conductivity metallisation layer is then deposited onto the dielectric layer to form the inner surface of the waveguide. The waveguide section is completed by the attachment, by soldering/thermocompression bonding, of a second metallised substrate.

Process flow steps are illustrated graphically in FIGS. 14A-14J, 15A-15G, 16A-16J, 17A-17C, and 18A-18D, which show devices with the micromachined waveguide fabricated in one single thick wafer, a so-called trapezoidal waveguide cross-section, as well as when the height of the micromachined waveguide is distributed evenly between two Silicon wafers as a hexagonal cross-section waveguide.

Figure 14A:
FIGS. 14A-14J and 15A-15G and 16A-16J and 17A-17C show schematically and exemplarily an embodiment of a process flow to arrive at a micromachined non-MEMS tuneable variable complex impedance device, where
Figure 14F:
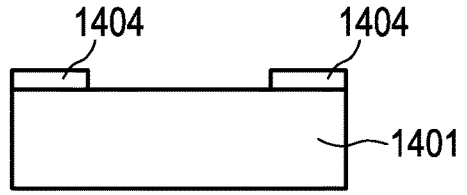
Figure 14B:
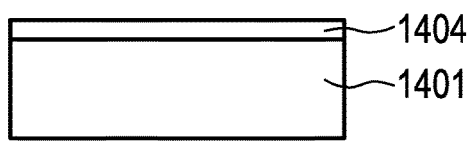
Figure 14G:
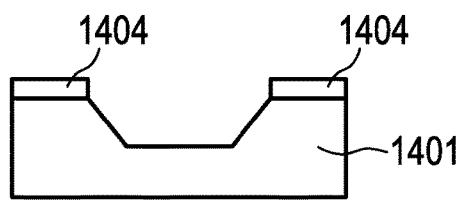
Figure 14C:
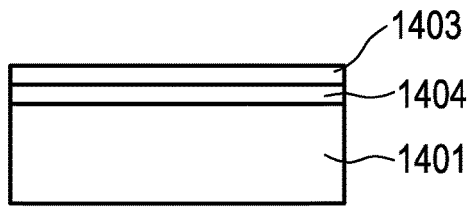
Figure 14H:
Figure 14D:
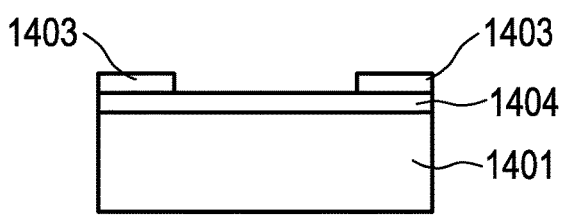
Figure 14I:
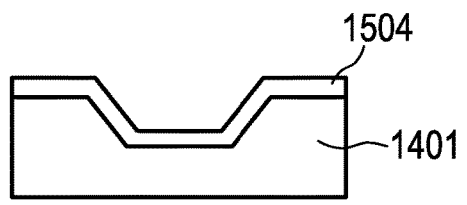
Figure 14E:
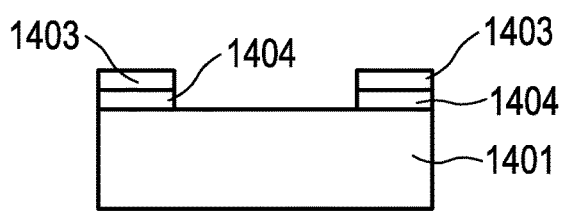

Referring to the process flow to arrive at a micromachined non-MEMS tuneable variable complex impedance device (illustrated in FIGS. 14A-14J and 15A-15G), FIG. 14A shows a Silicon wafer 1401. Next, as shown in FIG. 1B, a Silicon Nitride layer 1404 is formed on Silicon wafer 1401. In a subsequent step, a resist coating 1403 is applied to the Silicon Nitride layer as shown in FIG. 14C. After applying a lithography and developing step, a structure as shown in FIG. 14D is arrived at, where parts of the resist coating 1403 have been removed from selected areas. Next, Silicon Nitride etching is performed (cf. FIG. 14E) and the resist 1403 is stripped such that the resulting structure is the one shown in FIG. 14F. A KOH etching step is performed (shown in FIG. 14G). In a subsequent step, the remaining Silicon Nitride is stripped (FIG. 14H). A further Silicon Nitride 1504 layer is then grown as shown in FIG. 14I. Having applied a new resist coating 1503, the resulting structure is shown in FIG. 14J.

Figure 14J:
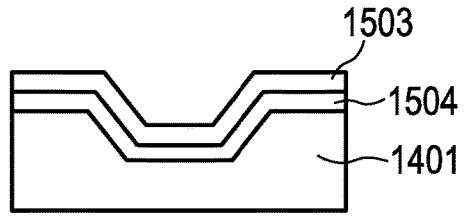
Figure 15A:
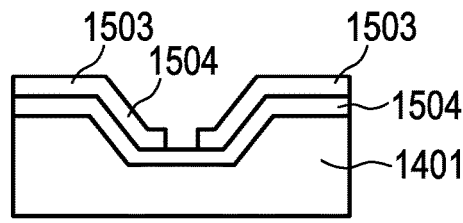
Figure 15B:
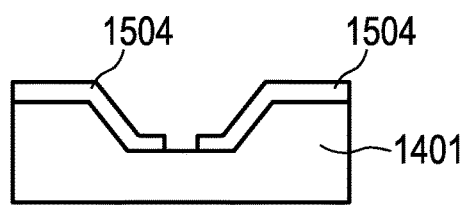
Figure 15C:
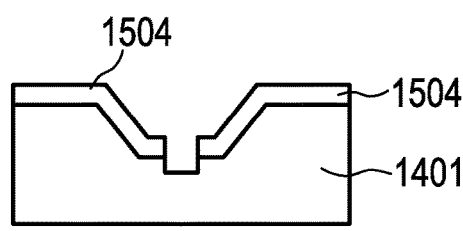
Figure 15D:
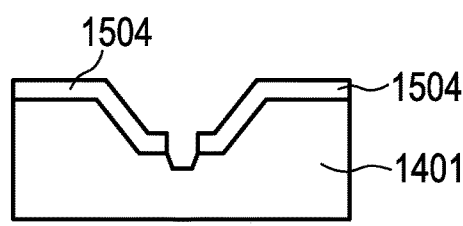
Figure 15E:
Figure 15F:
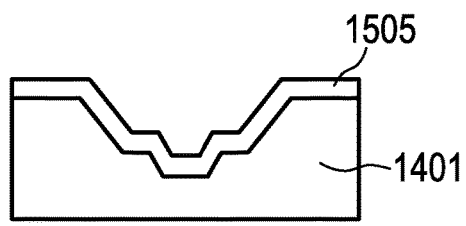
Figure 15G:
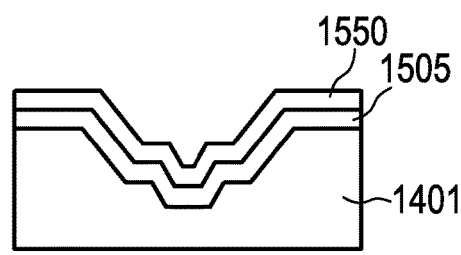

FIG. 15A shows Silicon wafer 1401 from FIG. 14J with Silicon Nitride layer 1504 and resist coating 1503 after having applied a lithography and developing step, where parts of the resist coating 1503 have been selectively removed, i.e., removed from selected areas. Next, as shown in FIG. 15B, a lithography and Silicon Nitride etching step is performed, where parts of Silicon Nitride layer 1504 have been selectively removed, i.e., removed from selected areas. The structure shown in FIG. 15B is then either subjected to deep reactive-ion etching (DRIE) (as shown in FIG. 15C) or to potassium hydroxide (KOH) or Tetramethyld Ammonium Hydroxide (TMAH) etching (as shown in FIG. 15D, which applies to both KOH and TMAH etching). In both cases, parts of the upper layer of Si wafer 1401 are selectively removed as shown in FIGS. 15C and 15D. Subsequent steps are explained with reference to the structure obtained from KOH/TMAH etching (FIG. 15D). Similar steps may be applied to the structure obtained from DRIE (FIG. 15C) as well. After stripping the remaining Silicon Nitride 1504, Si wafer 1401 exhibits the shape illustrated in FIG. 15E. Oxidising the Silicon leads to a SiO$_2$ layer 1505 on top of the Si wafer 1401, as shown in FIG. 15F. FIG. 15G illustrates Si wafer 1401 after a metallisation layer 1550 has been applied on top of SiO$_2$ layer 1505.

Figure 18A:
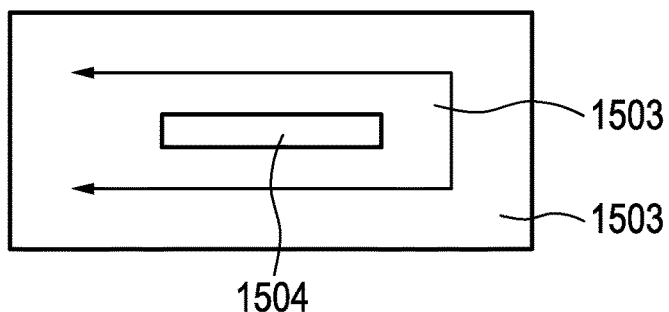
FIGS. 18A-18D show schematically and exemplarily top views of the wafer for the respective process flow steps described.
Figure 18B:
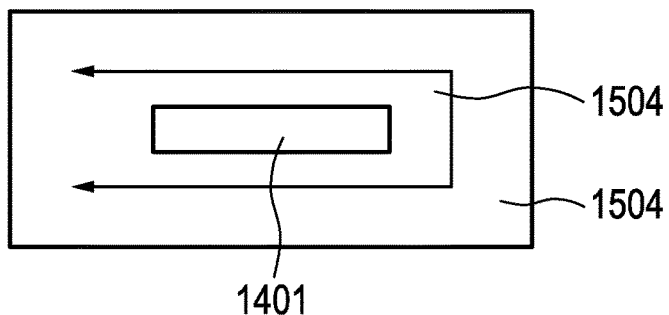
Figure 18C:
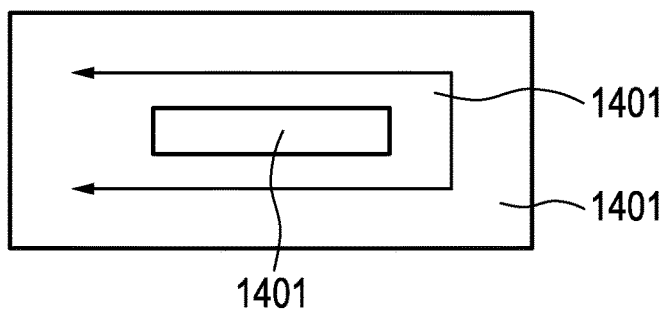
Figure 18D:
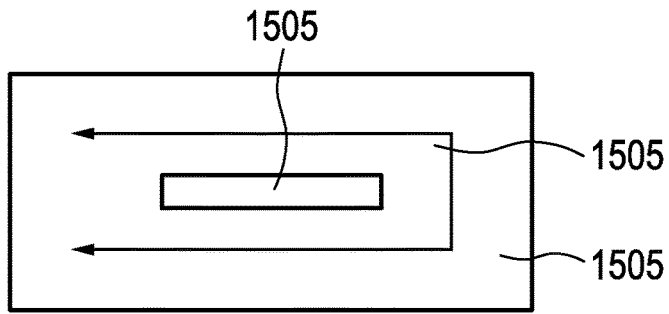

Top views of wafer 1401 for the respective process flow steps described herein above are shown in FIGS. 18A-18D, where FIG. 18A corresponds to FIG. 15A, FIG. 18B corresponds to FIGS. 15B-15D, FIG. 18C corresponds to FIG. 15E, and FIG. 18D corresponds to FIG. 15F. Arrows imply that the structure continues in the indicated direction. If one were to redraw FIG. 18A and replace all numerals 15XX by 16XX, then the new Fig. refers to an overhead view of FIG. 16D. Secondly, if one were to redraw FIG. 18B and replace '1504' by '1604' and replace '1401' by '1601', then the resulting new Fig. provides an overhead view of FIGS. 16F, 16G and 16H. Similarly, if one were to redraw FIG. 18C and replace '1401' by '1601', then the resulting new Fig. provides an overhead view of FIG. 16I. Lastly, if one were to redraw FIG. 18D replacing '1505' by '1605', the resulting Fig. provides an overhead view of FIG. 16J.

Figure 16A:
Figure 16F:
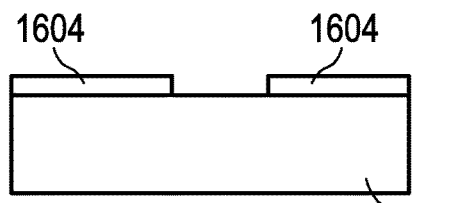
Figure 16B:
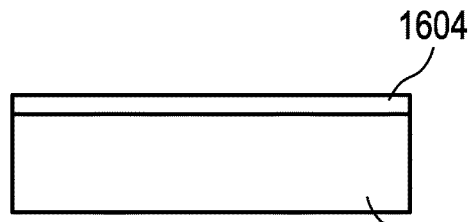
Figure 16G:
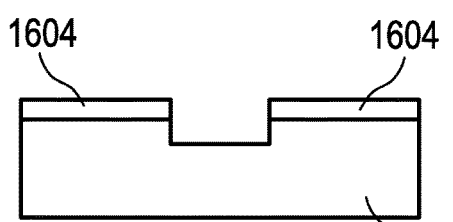
Figure 16C:
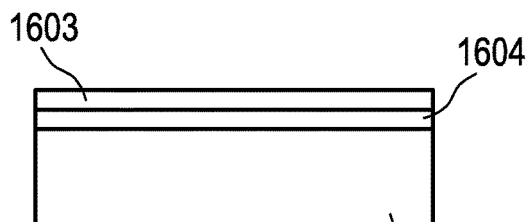
Figure 16H:
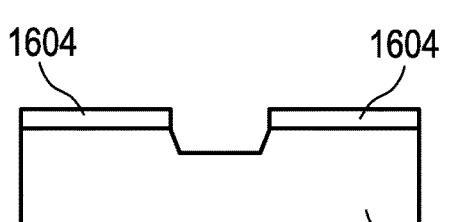
Figure 16D:
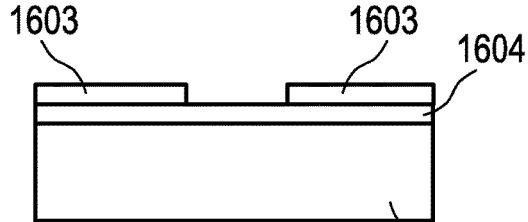
Figure 16I:
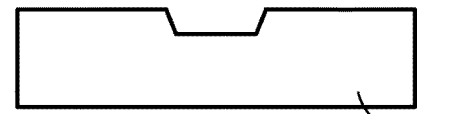
Figure 16E:
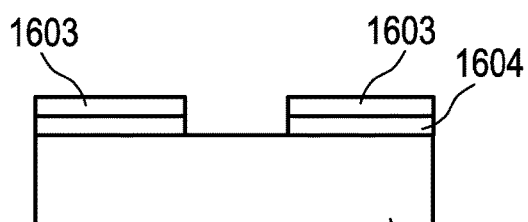
Figure 16J:
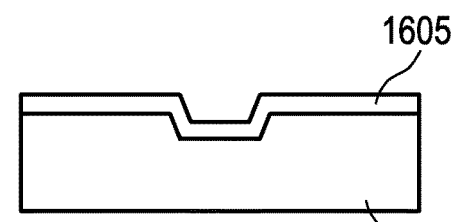
Figure 17A:
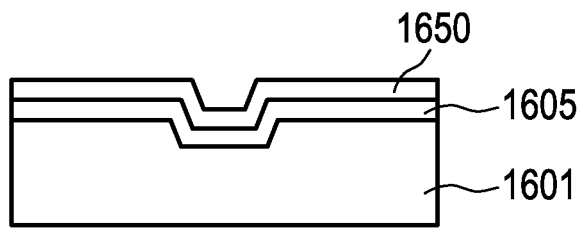
Figure 17B:
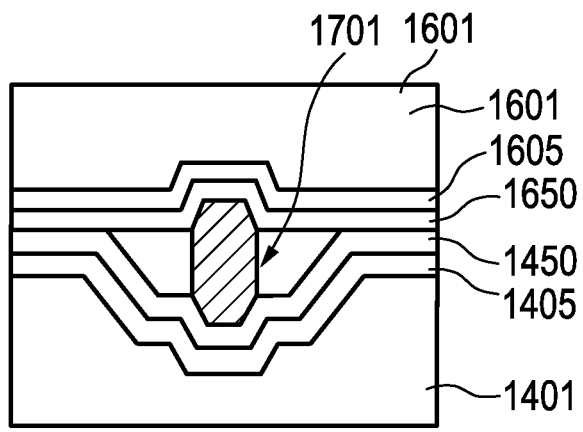

As illustrated by FIG. 17B, the resulting wafer may be used as one part for building a trapezoidal waveguide by combining it with wafer 1601 (as shown in FIG. 17A) (manufactured as explained in the following with reference to FIGS. 16A-16J and 17A-17B). In a similar manner, two of the wafers shown in FIG. 15G may be used to build a hexagonal waveguide shown in FIG. 17C.

As to the trapezoidal guide version, the process flow for manufacturing a second wafer (which is to be combined with the first wafer shown in FIG. 15G) is illustrated in FIGS. 16A-16J and 17A. FIG. 16A shows Silicon wafer 1601. As shown in FIG. 16B, a Silicon Nitride layer 1604 is applied to Silicon wafer 1601. A resist coating 1603 is subsequently formed on top of Silicon Nitride layer 1604 (see FIG. 16C). Next, as shown in FIG. 16D, a lithography and developing step is performed, where parts of resist coating 1603 are selectively removed. By applying deep reactive-ion etching to Silicon Nitride layer 1604, parts of Silicon Nitride layer 1604 are selectively removed, i.e., removed from selected areas, as illustrated by FIG. 16E. In a further step, resist coating 1603 is stripped from the wafer, leaving the structure shown in FIG. 16F. The structure shown in FIG. 16F is then either subjected to deep reactive-ion etching (DRIE) (as shown in FIG. 16G) or to potassium hydroxide (KOH) or Tetramethyl Ammonium Hydroxide (TMAH) etching (as shown in FIG. 16H, which applies to both KOH and TMAH etching). In both cases, parts of the upper layer of Si wafer 1601 are selectively removed as shown in FIGS. 16G and 16H. Subsequent steps are explained with reference to the structure obtained from KOH/TMAH etching (FIG. 16G). Similar steps may be applied to the structure obtained from DRIE (FIG. 16H) as well. After stripping the remaining Silicon Nitride 1604, Si wafer 1601 exhibits the shape illustrated in FIG. 16I. Oxidising the Silicon leads to a SiO$_2$ layer 1605 on the top of the Si wafer 1601, as shown in FIG. 16J. FIG. 17A illustrates Si wafer 1601 after a metallisation layer 1650 has been applied on top of SiO$_2$ layer 1605. A similar structure may be obtained starting from the wafer shown in FIG. 16H, the main difference being the different shapes of the DRIE-etched alignment slots for the ferrite element.

Figure 17C:
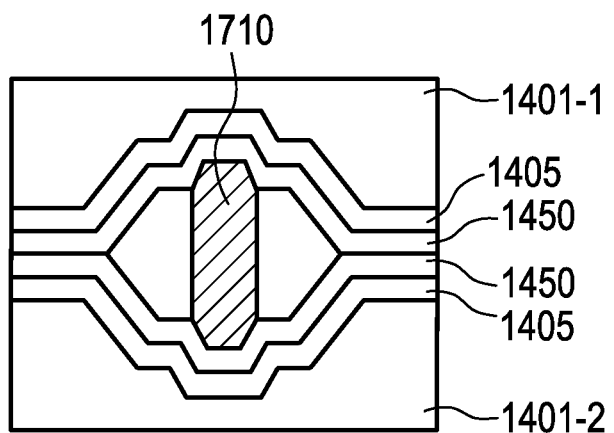

FIGS. 17B and 17C illustrate the assembly of a trapezoidal waveguide (FIG. 17B) or of a hexagonal waveguide (FIG. 17C). The Fig.Figs. show "end-on" cross-section views looking down the length of the micromachined waveguide and seeing the axially located ferrite rod/bar. The variants shown in FIGS. 17B and 17C assume the use of an extended DC magnetic biasing solenoid over the ferrite-filled cross-section. As shown in FIG. 17B, a Silicon wafer 1601 (e.g., produced according to the steps illustrated by FIGS. 16A-16J, 17A) is assembled together with a Silicon wafer 1401 (e.g., produced according to the steps illustrated by FIGS. 14A-14J, 15A-15G) to build a waveguide with trapezoidal cross-section (trapezoidal waveguide). Both Silicon wafers 1401, 1601 comprise notches to help centering and holding magnetic material 1710, which may be, e.g., a ferrite slab or a ferrite composite 310, 410, 610, 810, 1010, 1210. Magnetic material 1710 has been made earlier by the processes described previously in this filing i.e. magnetic material 1710 can be of one of the forms shown in FIG. 5F, 7E, 9F, 11E or 12F. Magnetic material 1710 is then placed into the alignment/holding notches shown in FIGS. 17B and 17C either manually or with some kind of automatic pick-and-place machine.

Wafers 1601 and 1401 are held together by metal-to-metal bonds formed by thermocompressing. Alternatively, the two wafers may be held together by conductive glue, etc. As shown in FIG. 17C, a Silicon wafer 1401-1 is assembled together with a Silicon wafer 1401-2 (e.g., both produced according to the steps illustrated by FIGS. 14A-14J, 15A-15G) to build a waveguide with hexagonal cross-section (hexagonal waveguide). Both Silicon wafers 1401-1, 1401-2 comprise notches to help centering and holding magnetic material 1710, which may be, e.g., a ferrite slab or a ferrite composite 310, 410, 610, 810, 1010, 1210. Wafers 1601 and 1401 are held together by metal-to-metal bonds formed by thermocompressing. Alternatively, the two wafers may be held together by conductive glue, etc.

The short-circuited section of waveguide is preceded by an adjustable phase-shifter device formed from a portion of the same micromachined waveguide that is axially loaded with a slab or rod of an appropriately selected and dimensioned ferrite material. A solenoid is provided externally to the ferrite loaded micromachined waveguide section either as a separate discrete wire-wound component or directly integrated into the semiconductor wafers forming the waveguide by the use of thin-film metallisation and through-substrate vias. The solenoid is oriented so as to provide a DC magnetic bias field that is either longitudinally or transversely aligned relative to the ferrite rod/bar and the direction of propagation of the electromagnetic wave along the micromachined waveguide. As will be familiar to those skilled in the art the device thus formed is a reciprocal phase-shifter also referred to as a Reggia-Spencer or Diamond Ordnance Fuze Laboratories (DOFL) phase-shifter. By varying the magnitude of the current supplied to the solenoid the phase-shift provided by the partially ferrite filled section of micromachined waveguide is alterable hence the reflection coefficient of the fixed position short-circuit 'seen' by any device connected to the input of the phase-shifter and short-circuit can be made to vary. Additionally, the height, width and the location and use of dielectric spacers can be used to achieve different levels of device sensitivity which is henceforth defined as the number of degrees of phase-shift achieved for a given DC magnetic bias field strength—see Reuss M L Jr. (1964), *A Study of a Ferrite Phase Shifter*, US Naval Research Laboratory, NRL Technical Report 6112, June 8. Provision of these dielectric spacers and a method of manufacturing the actual ferrite rod/bar (especially for millimeter-wave frequencies where conventional ceramics processing techniques are pushed to their limits) is described herein.

Referring to FIGS. 19A-19D, 20A-20D, 21A-21C, and 22A-22C, an additional example is a Silicon integrated version of the "cross-guide" phase shifter described by Reuss M L Jr. (1968), *Phase-Shift Enhancement by Mode-Suppression Techniques*, US Naval Research Laboratory, NRL Technical Report 6677, April 30. This gives a higher degree of sensitivity (more phase shift for a given applied magnetic field strength) which can lead to a shorter overall device length for a specified number of degrees of phase shift. This should also translate into lower device losses. Two Silicon wafers are used to share the full height of the micromachined waveguide along with the "cross guide" section which is of reduced height at the edges and of full height in the central region that bears the axially located ferrite rod/bar.

Figure 19A:
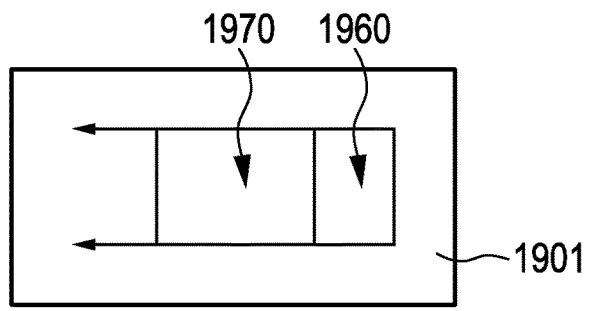
FIGS. 19A-19D, 20A-20D, 21A-21C, and 22A-22C show schematically and exemplarily an embodiment of a Silicon integrated version of the "cross-guide" phase shifter.
Figure 19B:
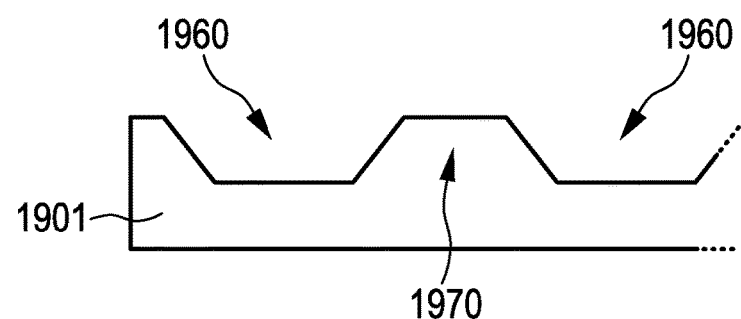
Figure 19C:
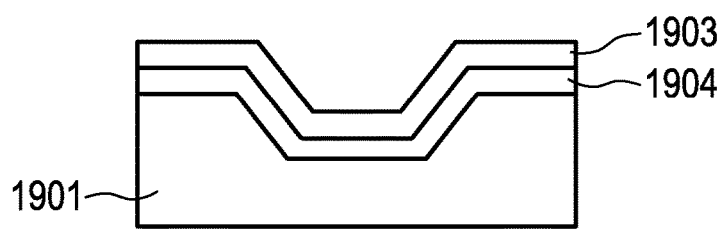
Figure 19D:
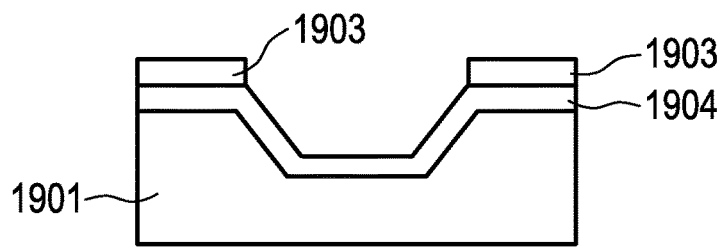
Figure 20A:
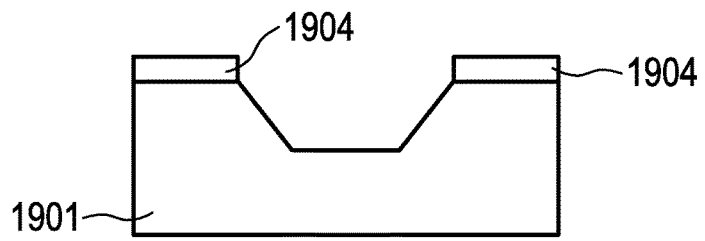

A Silicon wafer 1901 is manufactured according to the steps illustrated in FIGS. 14A-14I. However, the steps are not performed for the entire length of the micromachined guide. In particular, during the first KOH etching step (illustrated in FIG. 14G), non-ferrite-containing sections of the waveguide are etched only to a part of the intended depth $H_{Full}$. FIG. 19A illustrates a top view of wafer 1901. Here, ferrite region 1970 is a region to be KOH-etched containing axial ferrite depth $H_{Cross}$ ($H_{Ferrite} < H_{Full}$). Further, main guide 1960 is a region to be KOH-etched to the full design waveguide depth $H_{Full}$. A sideview of wafer 1901 is illustrated in FIG. 19B, where main guide 1960 as well as a region 1970 for the ferrite are indicated. After growing Silicon Nitride layer 1904 and applying resist coating 1903, the resulting structure is shown in FIG. 19C. FIG. 19D shows Silicon wafer 1901 from FIG. 19C with Silicon Nitride layer 1904 and resist coating 1903 after having applied a lithography and developing step, where parts of the resist coating 1903 have been selectively removed, i.e., removed from selected areas. Next, as shown in FIG. 20A, a lithography and Silicon Nitride etching step is performed, where parts of Silicon Nitride layer 1904 are selectively removed, i.e., removed from selected areas. The structure shown in FIG. 20A is then either subjected to deep reactive-ion etching (DRIE) or to potassium hydroxide (KOH) or Tetramethyl Ammonium Hydroxide (TMAH) etching.

Figure 20B:
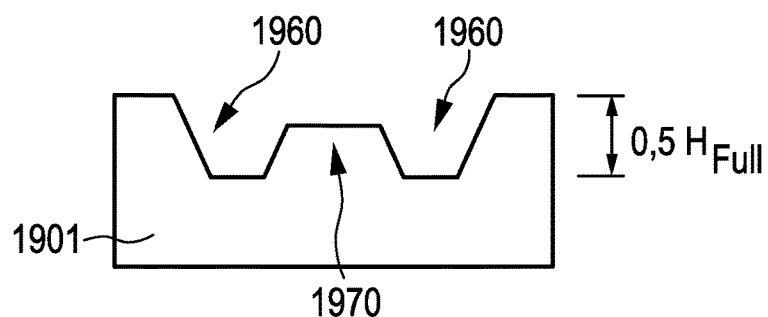
Figure 20C:
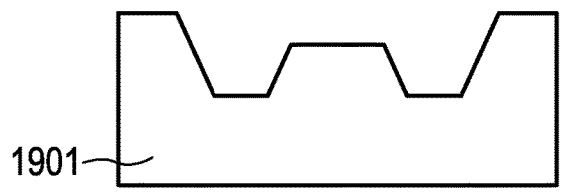
Figure 20D:
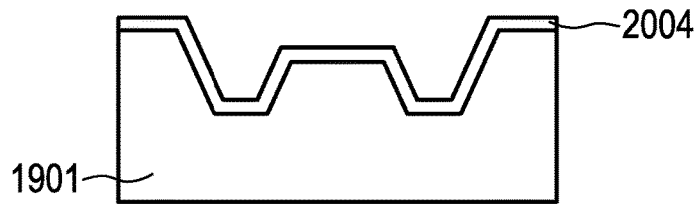

The corresponding side view to FIG. 20A can be seen in FIG. 20B. After stripping the remaining Silicon Nitride 1904, Si wafer 1901 exhibits the shape illustrated in FIG. 20C. Next, a further Silicon Nitride layer 2004 is grown on top of Si wafer 1901, as shown in FIG. 20D.

Figure 21A:
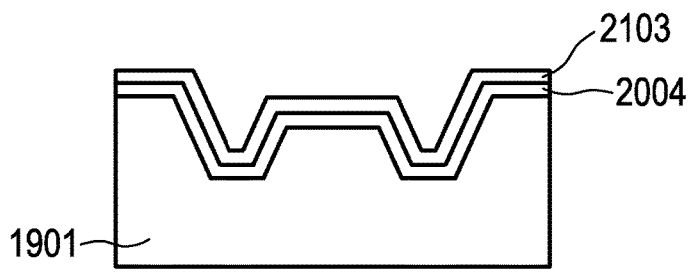
Figure 21B:
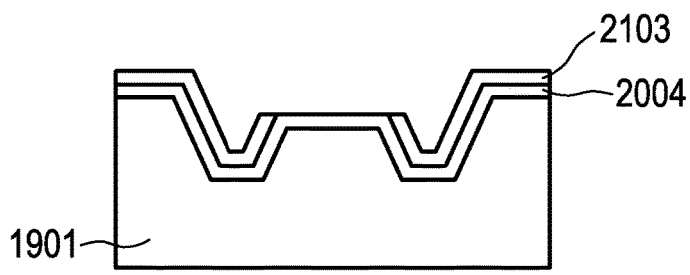
Figure 21C:
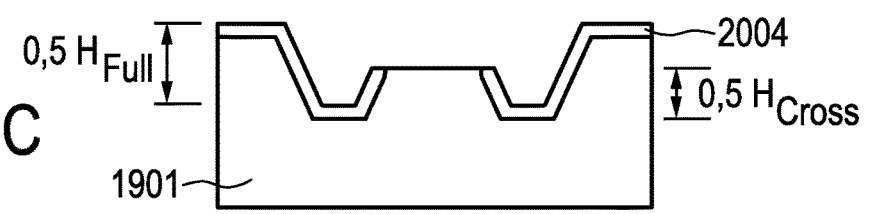

In a subsequent step, a resist coating 2103 is applied on top of Silicon Nitride layer 2004, see FIG. 21A. As illustrated by FIG. 21B, resist coating 2103 is selectively removed such that parts of Silicon Nitride layer 2004 become exposed. By removing the exposed Silicon Nitride and by further stripping the resist coating 2103, the resulting structure looks as shown in FIG. 21C. Therein, a ferrite alignment trench (or notch) may be etched as explained herein above with reference to FIGS. 15A-15F.

Figure 22A:
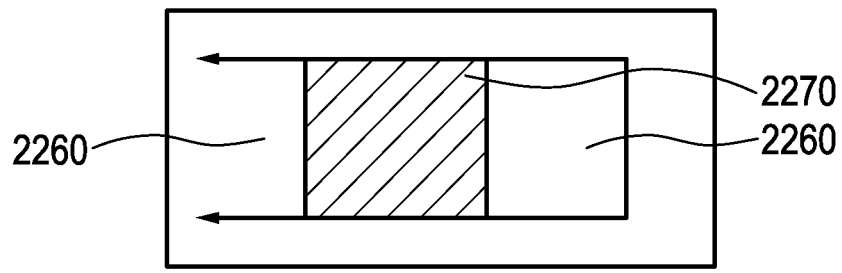
Figure 22B:
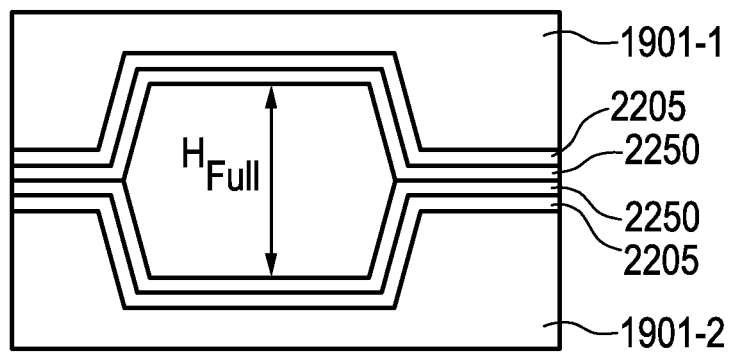
Figure 22C:
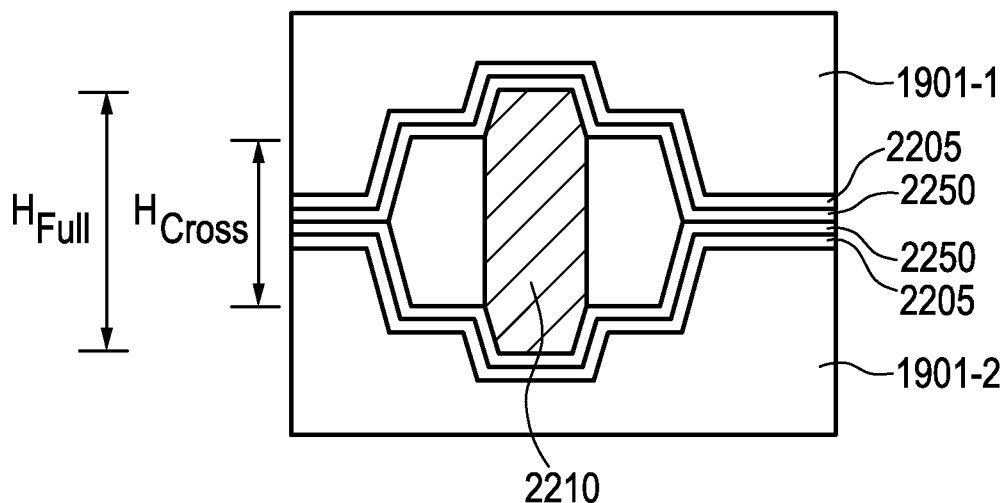

Referring to FIGS. 22A-22C, assembly of the cross-guide phase-shifting element is illustrated. FIG. 22A illustrates a top view showing full-height waveguide sections 2260 and cross-guide ferrite section 2270. A cross section of full-height waveguide sections 2260 is illustrated by FIG. 22B showing Silicon wafers 1901-1 and 1901-2 processed as outlined herein above with reference to FIGS. 19A-19D, 20A-20D, and 21A-21C. Silicon wafers 1901-1 and 1901-2 are covered by Silicon Dioxide layers 2205 and by metallisation layers 2250. Silicon wafers 1901-1 and 1901-2 are held together by metal-to-metal bonds (e.g., by thermocompression), by conductive glue, etc. A corresponding cross section cross-guide ferrite section 2270 (comprising the cross guide phase-shifter) is illustrated by FIG. 22C. In addition, magnetic material 2210 (e.g., ferrite) is shown in FIG. 22C.

How to build the E-H tuner is illustrated in FIGS. 23A-23E and 24A-24B.

Figure 23A:
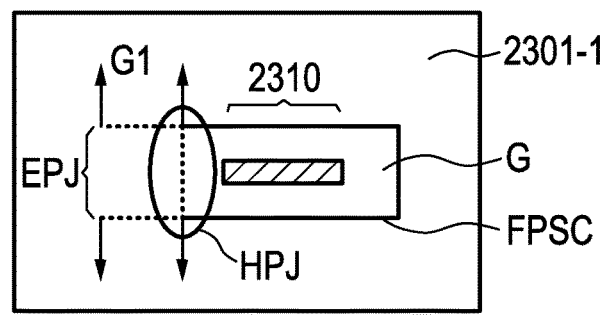
FIGS. 23A-23E and 24A-24B show schematically and exemplarily an embodiment of how to build an E-H tuner.

FIG. 23A shows a top view of a first wafer 2301-1. Micromachined main waveguide G1 is indicated as well as a further micromachined waveguide G and an axially located ferrite 2310. The H-plane junction is indicated by reference numeral HPJ. The location of a fixed position short circuit is denoted by reference FPSC. Further, EPJ denotes the location of the E-plane junction and E-plane bond to a second wafer 2301-2. The E-plane junction is shown as a dotted line because the E-plane waveguide is in the second wafer 2301-2 which is bonded on top of wafer 2301-1 such that the two waveguides couple together at the EPJ/junction A region. These two regions are the same, the markings in dotted lines in FIG. 23A are to indicate that the second waveguide G2 is located on top of main guide G1.

Figure 23B:
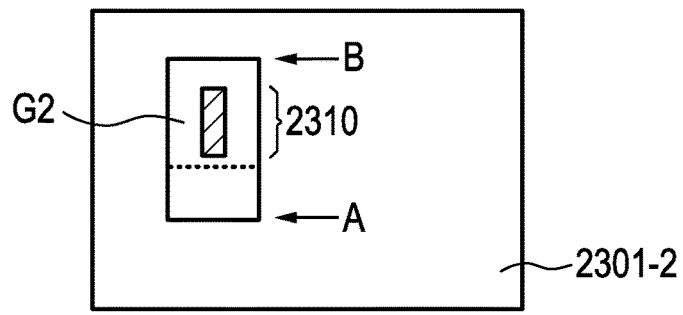

FIG. 23B shows a top view of a second wafer 2301-2. A micromachined waveguide G2 is indicated as well as an axially located ferrite 2310. The location of a fixed position short circuit is denoted by reference B. Further, A denotes the location of the E-plane junction to main guide G1 and the E-plane bond to the phase shifter section. A corresponding sideview of second wafer 2301-2 is shown in FIG. 23E.

Figure 23C:
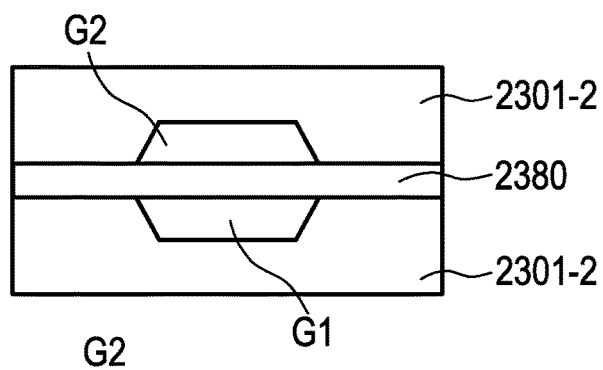
Figure 23D:
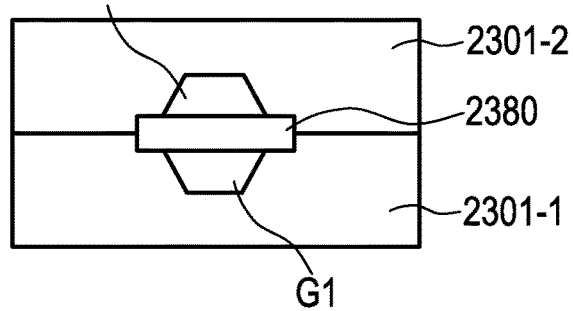
Figure 23E:
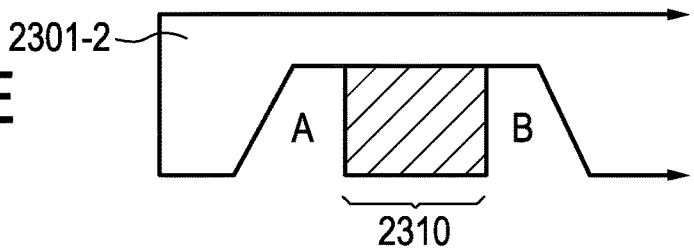

FIGS. 23C and 23D illustrate two options for E-plane junction regions EPJ and A in a cross-section view of the E-plane junction region. As shown in FIG. 23C, a spacer 2380 may extend along the entire cross-section of wafers 2301-1 and 2301-2. Alternatively, as shown in FIG. 23D, spacer 2380 may extend along parts of the cross-section of wafers 2301-1 and 2301-2. In both cases, spacer 2380 separates waveguide G1 from waveguide G2. In addition, in both cases, Silicon wafers 2301-1, 2301-2, and spacer 2380 are held together by electrically conductive bonds. In FIG. 23C the three wafers are 2301-2, 2301-1, and spacer element 2380 as the third wafer. In FIG. 23D there are only two Silicon wafers, i.e., 2301-1 and 2301-2. In FIG. 23D spacer 2380 is not made from a Silicon wafer but is from a good electrical conducting sheet material such as metal, carbon fibre, an appropriately conducting plastic etc.

Figure 24A:
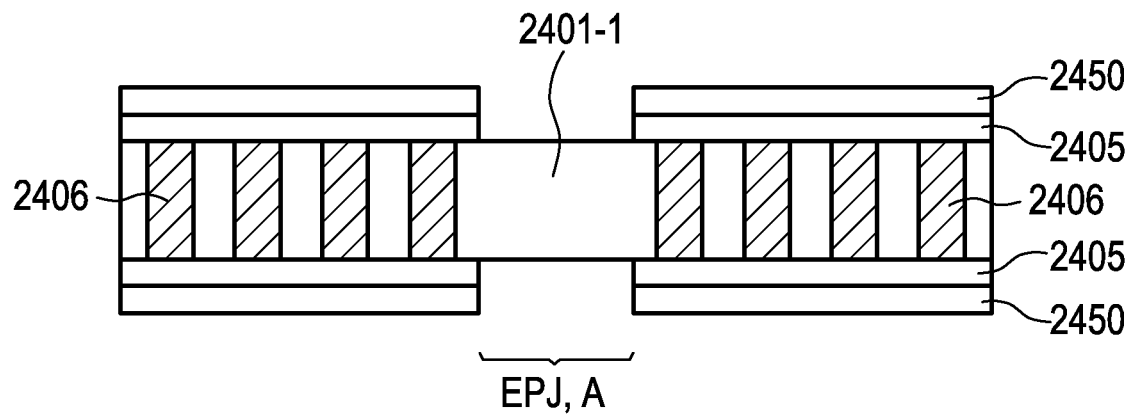
Figure 24B:
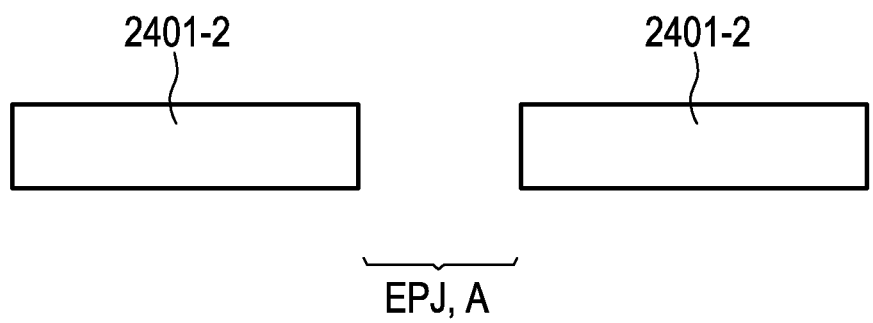

FIGS. 24A and 24B show more detailed views of spacer element 2380: Option 1 (illustrated in FIG. 23C with spacer detail shown in FIG. 24A) using three semiconductor wafers with a chemically etched slot in the E-plane junction region EPJ; and Option 2 (illustrated in FIG. 23D with spacer detail shown in FIG. 24B) using two wafers 2301-1 and 2301-2 together with a plasma etched slot and a metal/electrically conductive spacer, e.g., etched Beryllium Copper (BeCu) foil, carbon fibre reinforced plastic with a hole processed into it in the region of the E-plane junction EPJ.

Referring to FIG. 24A, there is shown a Silicon (high Ohmic) or printed circuit board. Spacer 2380 comprises Silicon wafer 2401-1. As shown in FIG. 24A, the front and back side of the spacer 2380 are covered by thermally grown $SiO_2$ layers 2405 and metallisation layers 2450. The front and backaside metallisation layers 2405 are linked together electrically by the use of through substrate vias 2406 which should be filled with a metal with a good electrical conductivity (such as, e.g., Copper). In the spacer's central part, E-plane coupling region EPJ, A is indicated. Region EPJ can be composed of the bulk Silicon wafer 2401-1 itself or can be an opening (such as, e.g., a hole) etched completely through Silicon wafer 2401-1, i.e., region EPJ is a void in the Silicon by one of several means for example deep reactive ion etching, laser drilling, isotropic etching using wet chemicals or gas phase etching, etc.

Referring to FIG. 24B, there is shown an electrically conducting spacer 2380 (e.g., Beryllium Copper foil or Carbon fibre reinforced plastic). The spacer 2380 comprises, e.g., metal, carbon fibre, heavily doped Silicon, etc. In the spacer's central part, E-plane coupling slot EPJ, A is punched, drilled, cut, or etched through the material.

Figure 25A:
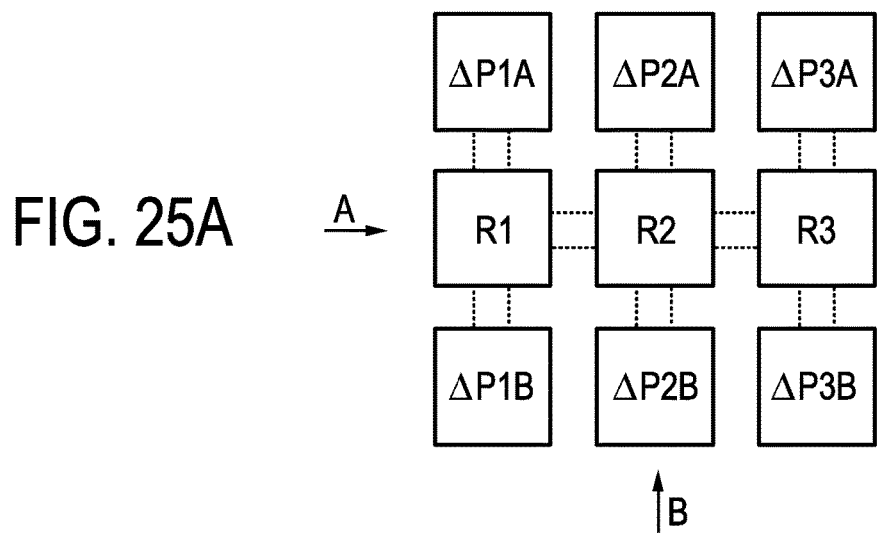
FIGS. 25A-25C show schematically and exemplarily an embodiment of how to build the frequency agile cavity filter using the device structure comprising the axial ferrite phase shifter waveguide section together with a fixed position short-circuit.
Figure 25B:
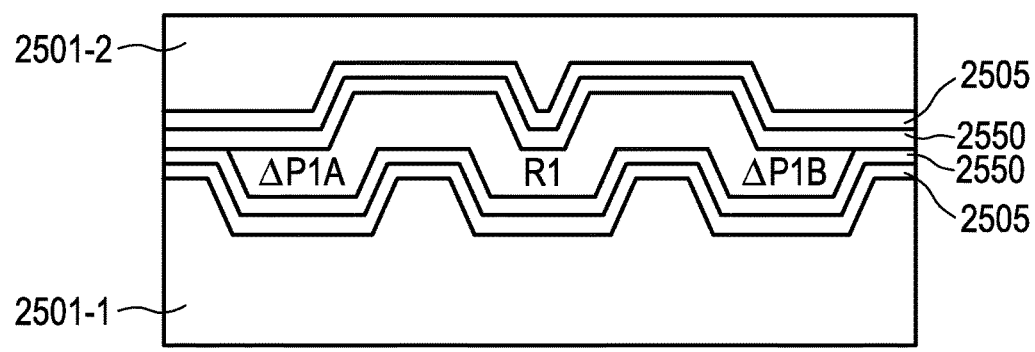
Figure 25C:
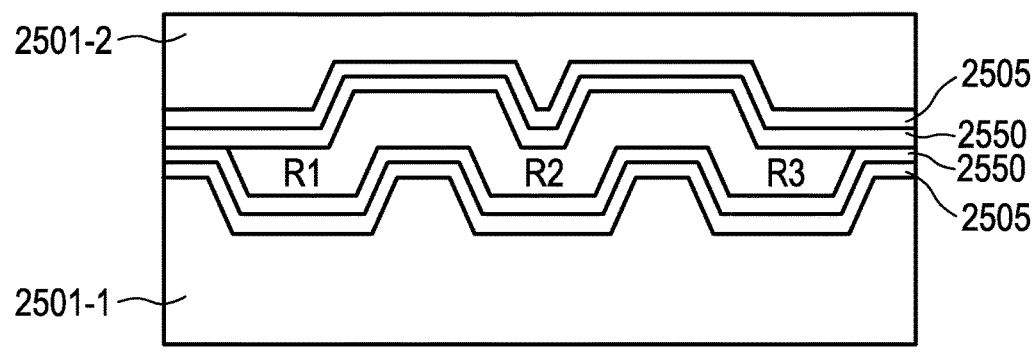

How to build the frequency agile cavity filter using the device structure comprising the axial ferrite phase shifter waveguide section together with a fixed position short-circuit is shown in FIGS. 25A-25C.

Referring to FIG. 25A, there is shown a top view of a non-MEMS tuned micromachined filter. Dotted lines are micromachined coupling sections in a second (e.g., upper) wafer. R1, R2, and R3 denote main micromachined cavity resonators formed in a first wafer 2501-1. ΔP1A, ΔP2A, ΔP3A, ΔP1B, ΔP2B, and ΔP3B denote micromachined waveguides comprising a fixed position short circuit and an axially located ferrite rod/bar for forming the reciprocal phase-shifter section. ΔP1A, ΔP2A, ΔP3A, ΔP1B, ΔP2B, and ΔP3B are fabricated in first wafer 2501-1. In some applications (such as, e.g., a hexagonal guide), ΔP1A, ΔP2A, ΔP3A, ΔP1B, ΔP2B, and ΔP3B are also fabricated in a second wafer 2501-2.

FIG. 25B shows a cross-section view of the filter shown in FIG. 25A along direction A. Both wafers 2501-1 and 2501-2 are covered by $SiO_2$ layers 2505, respectively. $SiO_2$ layers 2505 are covered by metallisation layers 2550, respectively.

FIG. 25C shows a cross-section view of the filter shown in FIG. 25A along direction B. Both wafers 2501-1 and 2501-2 are covered by $SiO_2$ layers 2505, respectively. $SiO_2$ layers 2505 are covered by metallisation layers 2550, respectively.

This has advantages over the design as shown in WO 2009/124730 A1 and in Gautier W (2010), *RF-MEMS Based Passive Components and Integration Concepts for Adaptive Millimeter Wave Front-Ends*, Thesis for the degree of Doktor-Ingenieur (Dr.-Ing), University of Ulm, Germany, 29 Oct. 2010, pages 45-54, in that the device here is fabricated entirely in the form of a micromachined waveguide. Consequently, the device will have lower losses, be more reliable and be more easily scalable to higher frequencies than the aforementioned design, Gautier (2010), which is based on microstrip lines and slot coupling followed by a wire bond to an external MEMs switch. The tuneable filter could also be built using the E-H tuner sections in place of the phase shifter and fixed position short-circuit. As an alternative to the phase shifting/magnitude and phase shifting based tuning of the filter response a Silicon integrated version of the amplitude modulator described by Bowness C, Owen J Q, Thomassen N E (1958), *A Low-power Amplitude Modulator at Microwave Frequencies*, IRE Canadian Convention, Toronto October 15, can be manufactured by adding horizontally located resistive sheets to the axially located ferrite rod/bar.

As described in Mills J B, Ocket I, John A (2011), *Waveguide Tuner Stabilized Ultra Low Phase Noise 60 GHz SiGe: C Oscillator MMIC*, 11th Topical Meeting on Silicon Monolithic Integrated Circuits in RF Systems, a microwave oscillator can be built by substituting an E-H plane tuner for a microwave cavity resonator while still achieving excellent phase noise from the active device. In place of an external metal waveguide tuner, the Silicon integrated version could be used to build a fully planar integrated high performance microwave/millimeter-wave oscillator.

As noted in Clavin A (1960), *Reciprocal Ferrite Phase Shifters—On Higher Order Modes*, IRE Transactions on Microwave Theory and Techniques, 8(2), 254-255, the phase shift of the Reggia-Spencer phase shifter is temperature dependent but this can be easily compensated for with a second magnetic bias field coil. Such an approach can be incorporated into the devices described here. Band gap diodes could be directly fabricated in the Silicon wafers bearing the phase shifter sections to provide an in-situ measurement of the device temperature.

In FIGS. 14-25, it is assumed that an external DC magnetic bias field coil is used. The cross-section drawings would be appropriately modified for the case of integrated bias field coils by the addition of through-wafer vias and front/backside metallisation on the wafer halves that form the device.

The ferrite rods/bars shown in the Fig.Figs. may have tapered ends for improved impedance matching to the non ferrite loaded sections of micromachined waveguide.

The present invention aims to overcome many of the reliability issues that currently challenge the acceptance and usage of RF MEMS devices for challenging environments, such as space, by removing all moving parts and relying upon materials and a mode of device operation that are already space-qualified and by providing a means of controlling the operating frequency of a microwave/millimeter-wave device by providing a variable terminating impedance (adjustable in phase and/or magnitude). This is combined with a novel method of manufacture and integration directly with the device, for example filter/antennas/waveguides/oscillator, using planar circuit geometry for low mass and volume and easy integration with other RF components such as circulators and integrated circuits thereby reducing the number of sources of RF loss, impedance mismatch and potential mechanical failure. The device is fabricated and assembled using standard semiconductor process technologies (photolithography, anisotropic and isotropic etching, thin-film metallisation, wafer sawing, die and wafer bonding) which provide the means for batch production and repeatability together with an extremely high level of precision in the manufactured device dimensions and hence operating frequency and tuning range.

The device has no moving parts and operates by providing an adjustable phase shifter ahead of a high reflection coefficient (low loss) fixed position short-circuit. Two co-located shunt and series adjustable short-circuit stubs, also referred to as an E-H tuner, can also be produced. They provide the ability to generate any complex reflection coefficient found on the Smith chart.

The device profits from the precision in the method of manufacture as well as its shown integration together with high Quality factor cavity resonators forming a frequency agile high selectivity filter as well as other devices. Use of the device together with a high Quality factor micromachined cavity resonator and an active (amplifying) element enables the production of ultra-low phase noise tuneable oscillators. In all examples, including the E-H tuner, can be fabricated in a planar circuit geometry. The phase shifting element can be combined with waveguide slot antennas to provide beamsteering as described by Reggia F, Spencer E G (1957), *A New Technique in Ferrite Phase Shifting for Beam Scanning of Microwave Antennas*, Proceedings of the IRE, Vol 45, November, 1510-1517.

An example application of the invention may be the use in Faraday rotation isolators, modulators, or polarizers. The invention can further be used in Ferrite rods for use in Reggia-Spencer shifters. Another example application of the invention are Ferrite rods with absorbing fins for use in Reggia-Spencer modulators. The invention can also be used in antiferromagnetic resonance isolators. Further example applications of the invention are ferrite rods or bars for use in nonreciprocal phase shifters.

In the above disclosed embodiments, example material combinations for adhesion layers onto which Gold metallization is deposited may be the following tri-layer structures:

1. Niobium sputtered in a pure Argon atmosphere/Niobium sputtered in a mixed Argon+Nitrogen atmosphere/Niobium sputtered in a pure Argon atmosphere/Gold layer;

2. $Titanium_{0.3}Tungsten_{0.7}$ sputtered in a pure Argon atmosphere/$Titanium_{0.3}Tungsten_{0.7}$ sputtered in a mixed Argon+Nitrogen atmosphere/$Titanium_{0.3}Tungsten_{0.7}$ sputtered in a pure Argon atmosphere/Gold layer;

3. Titanium or $Titanium_{0.3}Tungsten_{0.7}$ sputtered in a pure Argon atmosphere/Molybdenum sputtered in a pure Argon atmosphere/Molybdenum sputtered in a mixed Argon+Nitrogen atmosphere/Molybdenum sputtered in a pure Argon atmosphere/Gold layer.

These structures combine the functions of an adhesion layer and a so-called "stuffed" barrier layer to prevent Gold diffusion/creation of intermetallic compounds that could lead to unreliable/weak bonds (either eutectic or Gold/Gold thermocompression). In all of the following cases the layer listed first (most left in the list) is the layer preferably deposited onto the thermally grown Silicon Dioxide passivation layer on the Silicon wafer.

In the above disclosed embodiments, example material combinations for the magnetic materials may be Nickel Zinc Ferrite (preferably $Ni_{(1-x)}Zn_{(x)}Fe_2O_4$ with x values from the range 0<x<0.8), Lithium Ferrite ($Li_{0.5}Fe_{2.5}O_4$), substituted Lithium ferrites to increase the saturation magnetisation (e.g., Zinc substituted Lithium Ferrite, Aluminium substituted Lithium Ferrite, Titanium substituted Lithium Ferrite, and combined Aluminium-Titanium substituted Lithium Ferrite), Magnesium-Manganese ferrite (preferably $MgFe_{1.4}Mn_{0.02}O_4$.

Alternative substrate materials (into which the moulds are etched) could include Magnesium Titanate ($Mg_2TiO_4$ and $MgTiO_3$) and Forsterite ($Mg_2SiO_4$) to be etched with a mixture of Hydrofluoric Acid, Nitric Acid, and Acetic Acid.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or an does not exclude a plurality.

A single unit or device may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The present invention relates to a method of manufacturing a ferrite rod. The method comprises etching cavities into two semiconductor substrates and depositing ferrite layers into the cavities. The semiconductor substrates are attached to each other such that the ferriote layers form a ferrite rod. The present invention employs conventional photolithography and bulk isotropic micromachining of semiconductor wafers to precisely and repeatably form a template or mould, into which magnetic material can be deposited to form a Faraday rotation or phase-shifting element.

The invention claimed is:

1. A method of manufacturing a ferrite rod, the method comprising the steps of:
   etching a first cavity into a first surface of a first semiconductor substrate;
   depositing a first ferrite layer into the first cavity;
   etching a second cavity into a second surface of a second semiconductor substrate;
   depositing a second ferrite layer into the second cavity;
   attaching the first surface of the first semiconductor substrate to the second surface of the second semiconductor substrate such that the first ferrite layer contacts the second ferrite layer.

2. The method of claim 1, wherein said etching the first cavity into the first semiconductor substrate and said etching the second cavity into the second semiconductor substrate each comprise:
   performing isotropic semiconductor etching to selectively remove a layer of the first and second semiconductor substrates; and
   growing a passivation layer on the first and second semiconductor substrates.

3. The method of claim 2, wherein attaching the first surface of the first semiconductor substrate to the second surface of the second semiconductor substrate comprises, for at least one semiconductor substrate of the first and second semiconductor substrates:

applying a resist coating to a surface of a semiconductor substrate comprising the first or second cavity;
performing a lithography and developing step to selectively remove the resist coating;
performing a first etching step to selectively remove at least a part of the passivation layer;
stripping the resist coating) from the surface of the semiconductor substrate;
assembling the first and second semiconductor substrates such that the respective first and second surfaces face each other.

4. The method of claim 3, wherein the method further comprises the steps of:
chemical mechanical polishing of the first surface of the first semiconductor substrate;
applying a second resist coating;
performing a lithography and developing step to selectively remove the second resist coating; and
heating the assembled structure comprising the first and second semiconductor substrates.

5. The method of claim 4, wherein the method further comprises the steps of:
depositing a gold and adhesion layer on the second surface of the second semiconductor substrate;
etching the gold and adhesion layer; and
stripping the second resist coating;
wherein said heating the assembled structure comprises heating the assembled structure to create eutectic Gold:Silicon bonds.

6. The method of claim 4, wherein the method further comprises the steps of:
depositing a gold and adhesion layer on the second resist coating and on the second surface of the second semiconductor substrate; and
lifting off the second resist coating;
wherein said heating the assembled structure comprises heating the assembled structure to create eutectic Gold:Silicon bonds.

7. The method of claim 3, wherein the method further comprises the steps of:
applying a second resist coating;
performing a lithography and developing step to selectively remove the second resist coating; and
applying heat and pressure to the assembled structure comprising the first and second semiconductor substrates.

8. The method of claim 7, wherein the method further comprises the steps of:
depositing a gold and adhesion layer on the respective first or second surface, wherein said applying a second resist coating comprises applying the second resist coating to the gold and adhesion layer; and
etching the gold and adhesion layer;
wherein the method further comprises the step of stripping of the second resist coating;
wherein said applying heat and pressure to the assembled structure comprises applying heat and pressure to the assembled structure to create Gold:Gold bonds.

9. The method of claim 3, wherein the method further comprises applying a glue layer on the respective first or second surface; and
curing the glue layer.

10. The method of claim 1, wherein etching the first cavity into the first semiconductor substrate and etching the second cavity into the second semiconductor substrate each comprise:

growing a first passivation layer on the first and second semiconductor substrates;
applying a resist coating to the first passivation layer;
performing a lithography and developing step to selectively remove the resist coating;
performing a first etching step to selectively remove the first passivation layer;
stripping the resist coating from the first passivation layer;
performing isotropic semiconductor etching to selectively remove a layer of the first and second semiconductor substrates;
stripping the first passivation layer; and
growing a second passivation layer.

11. The method of claim 10, wherein said first etching step comprises an anisotropic etching step, and wherein said growing a first passivation layer comprises
thermally oxidising the first and second semiconductor substrates such that the first passivation layer comprises a first oxidation layer; and/or
applying low-stress low-pressure chemical vapour deposition to the first and second semiconductor substrates such that the first passivation layer comprises a nitride layer.

12. The method of claim 1, wherein said depositing the first and second ferrite layers into the first and second cavities comprises:
arc plasma spraying of the first and second ferrite layers in powder form; and/or
performing wet chemical deposition of the first and second ferrite layers.

13. The method of claim 12, wherein said depositing the first and second ferrite layers into the first and second cavities further comprises:
annealing of the first and second ferrite layers;
chemical mechanical polishing of the first and second ferrite layers and/or hot phosphoric acid wet etching of the first and second ferrite layers.

14. A ferrite rod comprising:
a first ferrite layer deposited in a cavity in a first surface of a first semiconductor substrate and a second ferrite layer deposited in a second cavity in a second surface of a second semiconductor substrate, the first surface being attached to the second surface and the first ferrite layer being in contact with the second ferrite layer;
wherein the ferrite rod further comprises a passivation layer arranged between said first ferrite layer and said second ferrite layer.

15. An electronic device comprising:
a semiconductor substrate comprising a first semiconductor substrate and a second semiconductor substrate; and
a ferrite rod comprising a first ferrite layer deposited in a cavity in a first surface of the first semiconductor substrate and a second ferrite layer deposited in a second cavity in a second surface of the second semiconductor substrate, the first surface being attached to the second surface and the first ferrite layer being in contact with the second ferrite layer;
wherein the ferrite rod is integrated in the semiconductor substrate.

16. An electronic device as claimed in claim 15, wherein the electronic device comprises a phase shifting device that includes the ferrite rod.

* * * * *